(12) United States Patent
Frederick et al.

(10) Patent No.: US 7,276,911 B2
(45) Date of Patent: Oct. 2, 2007

(54) DETECTION OF MALFUNCTIONING BULBS IN DECORATIVE LIGHT STRINGS

(75) Inventors: W. Richard Frederick, Hardy, VA (US); Ronald Miles, Evington, VA (US)

(73) Assignee: Integrated Power Components, Inc., Hardy, VA (US)

( * ) Notice: Subject to any disclaimer, the term of this patent is extended or adjusted under 35 U.S.C. 154(b) by 0 days.

(21) Appl. No.: 11/315,718

(22) Filed: Dec. 22, 2005

(65) Prior Publication Data

US 2006/0097726 A1    May 11, 2006

Related U.S. Application Data

(63) Continuation-in-part of application No. 10/703,858, filed on Nov. 6, 2003, now Pat. No. 6,984,984, and a continuation-in-part of application No. 10/041,032, filed on Dec. 28, 2001, now Pat. No. 6,734,678.

(60) Provisional application No. 60/289,865, filed on May 9, 2001, provisional application No. 60/277,481, filed on Mar. 20, 2001.

(51) Int. Cl.
*G01R 31/00* (2006.01)
*H05B 37/03* (2006.01)
*G01R 31/302* (2006.01)

(52) U.S. Cl. ............... 324/414; 324/530; 315/185 S

(58) Field of Classification Search ........ 324/403–414, 324/156, 457, 750, 537, 550, 556, 627, 530; 315/185 S
See application file for complete search history.

(56) References Cited

U.S. PATENT DOCUMENTS

| | | | |
|---|---|---|---|
| 3,063,006 A | 11/1962 | Steinberger | 324/51 |
| 3,214,579 A | 10/1965 | Pacini | 240/10 |
| 3,749,975 A | 7/1973 | Walters | 315/227 R |
| 3,964,040 A | 6/1976 | Behl | 340/251 |
| 4,034,259 A | 7/1977 | Schoch | 315/93 |
| 4,224,540 A * | 9/1980 | Okubo | 307/400 |
| 4,233,543 A | 11/1980 | Hickok | 315/75 |
| 4,340,841 A | 7/1982 | Schupp | 315/75 |
| 4,425,605 A | 1/1984 | Cheng | 362/227 |
| 4,608,508 A | 8/1986 | Ohnishi | 310/339 |
| 4,610,624 A | 9/1986 | Bruhn | 431/255 |

(Continued)

FOREIGN PATENT DOCUMENTS

WO    WO 02/075862 A1    9/2002

OTHER PUBLICATIONS

Christmas Wonderland Website: www.christmaswonderland.org, Just the FAQS (Frequently Asked Questions), Feb. 15, 2003, p. 3.
Christmas Factory Website: www.christmasfactory.com, Christmas Factory Catalog Intro., Feb. 15, 2003, 1 page.

(Continued)

*Primary Examiner*—Anjan Deb
(74) *Attorney, Agent, or Firm*—Nixon Peabody LLP

(57) ABSTRACT

A system for locating a malfunctioning bulb in a decorative light string uses an antenna that produces an output signal corresponding to the strength of the electric field produced by a portion of the light string near the antenna. An amplifier is coupled to the antenna to receive the antenna output signal and produce an amplified output signal representing the strength of the electric field. The amplifier includes a negative feedback circuit to improve the stability of the amplifier. A detector receives the amplifier output signal and activates an alarm device when the amplifier output signal is above or below a predetermined threshold representing a known operational condition of the light string.

13 Claims, 12 Drawing Sheets

U.S. PATENT DOCUMENTS

| | | | |
|---|---|---|---|
| 4,646,338 A | 2/1987 | Skillicorn | 378/110 |
| 4,727,449 A | 2/1988 | Fleck | 361/54 |
| 4,943,752 A | 7/1990 | Todd et al. | 310/339 |
| 5,008,626 A | 4/1991 | Boyd, Sr. | 324/414 |
| 5,032,961 A | 7/1991 | Pouyanne et al. | 362/251 |
| 5,047,721 A * | 9/1991 | Farley | 324/414 |
| 5,065,067 A | 11/1991 | Todd et al. | 310/339 |
| 5,150,058 A * | 9/1992 | Johnson | 324/519 |
| 5,150,964 A | 9/1992 | Tsui | 362/251 |
| 5,179,339 A | 1/1993 | Volk, Jr. | 324/414 |
| 5,262,697 A | 11/1993 | Meury | 310/339 |
| 5,290,986 A | 3/1994 | Colon et al. | 219/770 |
| 5,317,491 A | 5/1994 | Lee | 362/249 |
| 5,319,312 A | 6/1994 | Segilia | 324/556 |
| 5,365,145 A | 11/1994 | Fields | 315/86 |
| 5,369,363 A | 11/1994 | Hey | 324/414 |
| 5,453,664 A | 9/1995 | Harris | 315/185 |
| 5,539,317 A * | 7/1996 | Janning | 324/414 |
| 5,604,436 A | 2/1997 | Henritzy et al. | 324/414 |
| 5,676,250 A | 10/1997 | Walters | 206/419 |
| 5,745,410 A | 4/1998 | Yiu et al. | 365/185.11 |
| 5,877,618 A | 3/1999 | Luebke et al. | 324/72.5 |
| 5,892,357 A * | 4/1999 | Woods et al. | 324/96 |
| 5,955,845 A | 9/1999 | Fellows | 315/189 |
| 5,975,717 A | 11/1999 | Rahman | 362/251 |
| 5,995,588 A * | 11/1999 | Crick | 379/22 |
| 6,031,742 A | 2/2000 | Journeau | 363/60 |
| 6,065,958 A | 5/2000 | Adams et al. | 431/153 |
| 6,095,796 A | 8/2000 | Sung | 431/153 |
| 6,095,799 A | 8/2000 | McDonough et al. | 431/255 |
| 6,116,892 A | 9/2000 | Yang | 431/153 |
| 6,224,228 B1 | 5/2001 | Frederick | 362/116 |
| 6,344,716 B1 | 2/2002 | Gibboney, Jr. | 315/185 S |
| 6,480,001 B2 | 11/2002 | Frederick | 324/403 |
| D467,150 S | 12/2002 | Frederick | D8/68 |
| 6,518,707 B2 | 2/2003 | Gershen et al. | 315/129 |
| 6,556,018 B2 | 4/2003 | Benton | 324/414 |
| 6,603,302 B2 * | 8/2003 | Prineppi | 324/133 |
| 6,710,602 B2 | 3/2004 | Frederick | 324/414 |
| 6,734,678 B2 | 5/2004 | Frederick | 324/414 |
| 6,984,984 B2 | 1/2006 | Frederick et al. | 324/414 |
| 2002/0180455 A1 * | 12/2002 | Okano et al. | 324/530 |

OTHER PUBLICATIONS

Roman, Inc. Rep Website: rep.roman.com, Item Lookup, Feb. 18, 2003, 1 page.
Lincoln Imports, Ltd. Website: www.e-silkflower.com, Troubleshooting Using the Tester for Pre-Lighted Trees, Feb. 19, 2003, 2 pages.
Brite Star Light Tester Operating Instructions, 2 pages (2000).
TruServ® Retail Merchandise Planogram—Trim A Tree, TruServ® Lighting Accessories T351010 Basic, 4 pages (1999).
The Mosmarx Voltage Multiplier, A d.c.-d.c. Converter with Excellent Efficiency by P.E.K. Donaldson, 3 pages.
Performance Certification to EMC Directive, Normative Standards: Federal Communication Part 15, Test Unit Description and Serial No.: Roam Lights High Voltage Light Tester Item # 161255, dated Mar. 6, 2003, 25 pages.
ST Product Literature for Hex Inverter Model No. HCF4069UB, dated Sep. 2001, 7 pages.
Fairchild Semiconductor Product Literature for Model 1N/FDLL 914/A/B / 4148 / 4448, Copyright 2001, 4 pages.
Microchip Technology, Inc. PIC12F629/675 Data Sheet, 8-Pin FLASH-Based 8-Bit CMOS Microcontrollers, Copyright 2002, 12 pages.
Information Concerning Model SF102 "Buzz Box, " 1 page (as early as 1999).
Photograph of Internal View of Roman's Model SF102 "Buzz Box," 1 page (as early as 1999).
Roman Lights High Voltage Light Tester Instructions for Safe Use, 1 page (as early as 1999).

* cited by examiner

DETECTION OF MALFUNCTIONING BULBS IN DECORATIVE LIGHT STRINGS

CROSS-REFERENCE TO RELATED APPLICATIONS

This application is a continuation in part of U.S. Ser. No. 10/703,858 filed Nov. 6, 2003 now U.S. Pat. No. 6,984,984 and a continuation in part of U.S. Ser. No. 10/041,032 filed Dec. 28, 2001 now U.S. Pat. No. 6,734,678, claiming priority to U.S. Provisional Application Ser. No. 60/277,481 filed Mar. 20, 2001, and to U.S. Provisional Application Ser. No. 60/289,865 filed May 9, 2001.

FIELD OF THE INVENTION

The present invention relates to the detection of malfunctioning bulbs in decorative light strings, such as Christmas tree lights.

SUMMARY OF THE INVENTION

In accordance with the present invention, there is provided a system for locating a malfunctioning bulb in a decorative light string by using an antenna that produces an output signal corresponding to the strength of the electric field produced by a portion of the light string near the antenna. An amplifier is coupled to the antenna to receive the antenna output signal and produce an amplified output signal representing the strength of the electric field. The amplifier includes a negative feedback circuit to improve the stability of the amplifier. A detector receives the amplifier output signal and activates an alarm device when the amplifier output signal is above or below a predetermined threshold representing a known operational condition of the light string.

BRIEF DESCRIPTION OF THE DRAWINGS

The invention may best be understood by reference to the following description taken in conjunction with the accompanying drawings, in which.

DETAILED DESCRIPTION OF THE PREFERRED EMBODIMENTS

Although the invention will be described in connection with certain specific embodiments, it will be understood that the invention is not limited to those particular embodiments. On the contrary, the invention is intended to include all alternatives, modifications and equivalent arrangements as may be included within the spirit and scope of the invention as defined by the appended claims.

Figure 1:
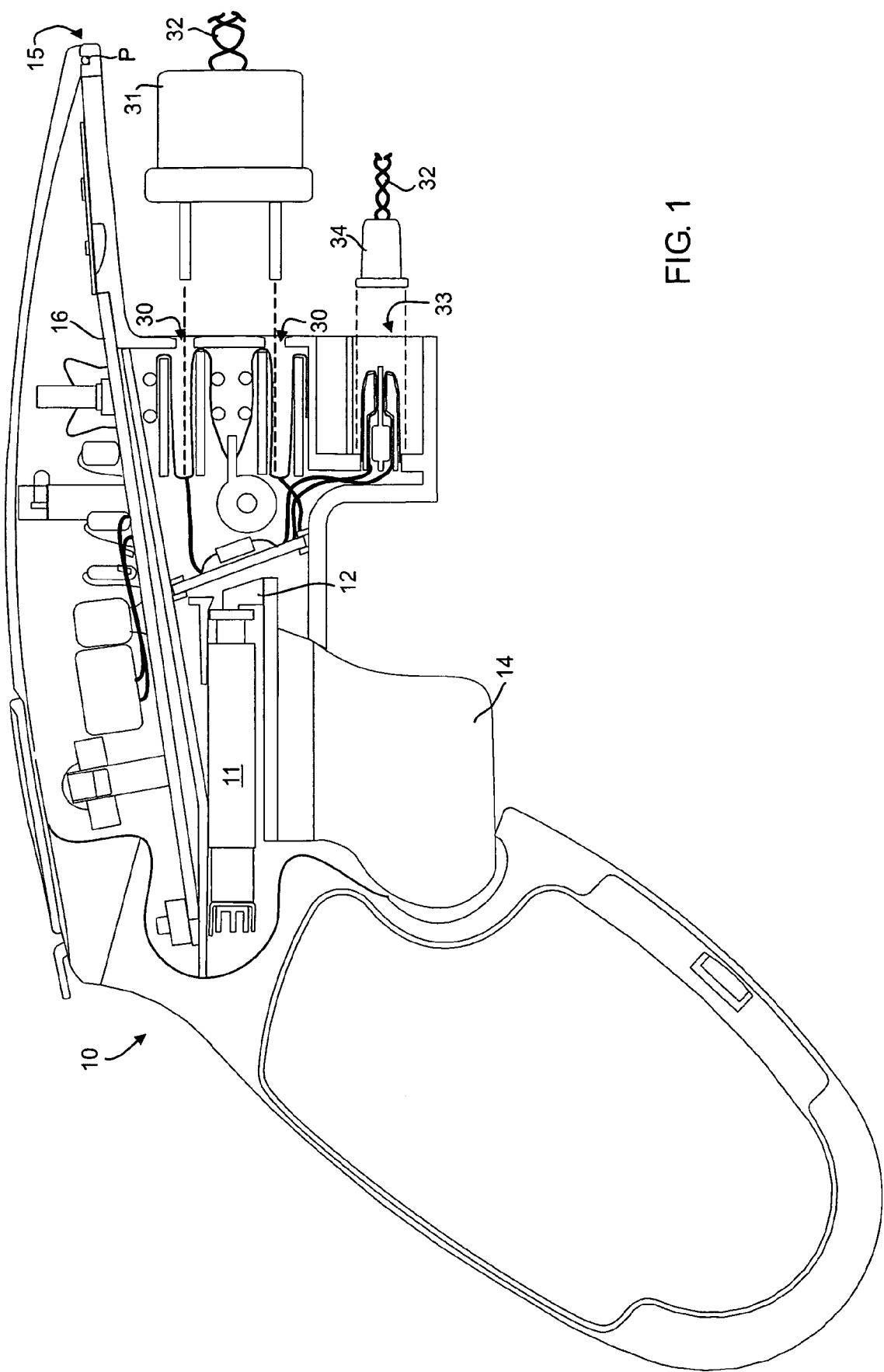
FIG. 1 is a diagram of a string of decorative lights being plugged into a detection device embodying the present invention, with the detection device shown in side elevation with a portion of the housing broken away to show the internal structure, portions of which are also shown in section.
Figure 3:
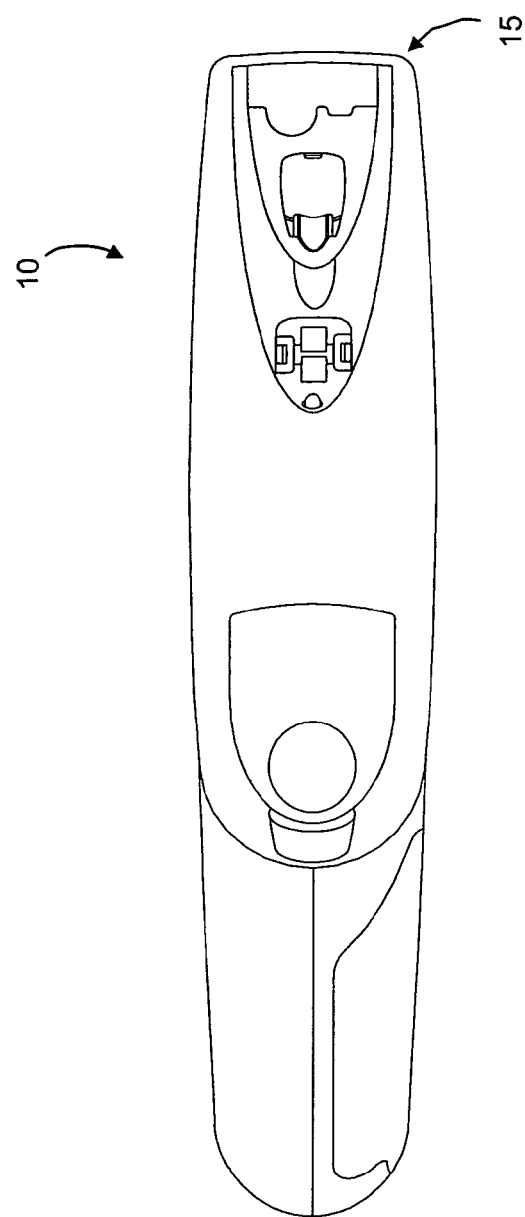
FIG. 3 is a top plan view of the embodiment shown in FIG. 2.
Figure 2:
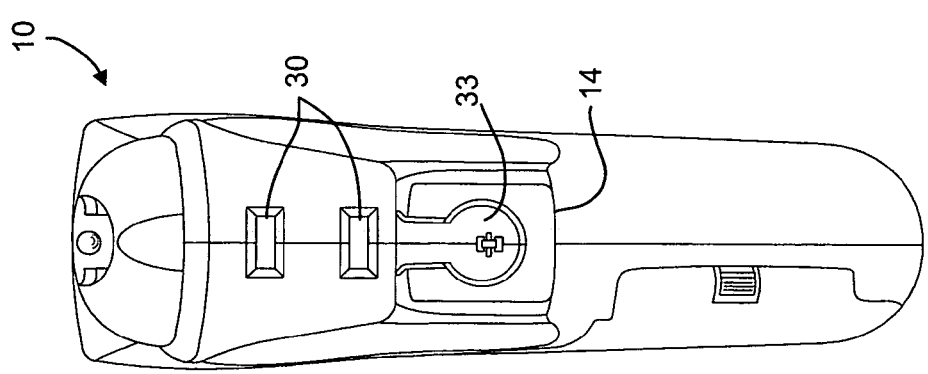
FIG. 2 is a front-end elevation of the detection device that is partially shown in FIG. 1.

In the illustrative embodiment shown in FIGS. 1-3, a portable, hand-held housing 10 contains a conventional high voltage generator for generating an electrical signal at a greater magnitude than the standard AC power line voltage. In this embodiment, the high voltage generator is a piezoelectric device 11 of the type used in lighters for gas grills, for example. The piezoelectric device 11 is actuated by a lug 12 carried by a trigger 14 that extends out of the housing 10. When the trigger 14 is pulled, the lug 12 is moved to the left as viewed in FIG. 1 and engages one end of the piezoelectric device 11, as described in more detail in U.S. Patent Application Publication No. US 2004/0130331 A1. The force applied to the piezoelectric device 11 produces a rapidly rising output voltage.

It is preferred to use commercially available piezoelectric devices in which the striking mechanism device strikes two crystals in tandem, producing an output pulse that is the sum of the pulses produced by both crystals. The output of the piezoelectric device 11 is applied to a socket 30, which is used for receiving a plug 31 on the end of a light string 32, and also to a socket 33, which mates with a light socket 34 on a miniature light set 32. The piezoelectric pulse may be applied to the light string using either socket 30 or socket 33. The trigger 14 is typically pulled several times to supply repetitive pulses to the light string. Using either socket, substantially the entire voltage of each pulse is applied to any inoperative shunt in a failed bulb in the light string, because the failed shunt in a failed bulb appears as an open circuit in the light string.

Sockets 30 and 33 both apply high voltage pulses to a defective light string. They do so in completely different manners, however. The procedure when using them is therefore dependent on the socket chosen. The differing methods are described below.

To use socket 30, the AC plug 31 of the light string 32 is first unplugged from the AC power source and connected to socket 30. The high voltage pulse is then applied via the AC plug 31 to the entire light string. In cases where there are several strings wired together in parallel, such as with 100 and 150 light sets (which consist of either two or three 50 light sets wired in parallel), the pulse will appear simultaneously across all the strings. The pulse generator can normally generate a high voltage, but only at a low current. If one (or more) of the paralleled strings is still functional, that string will appear as a low resistance path across the high voltage generator, and act as a short, thereby preventing the high voltage pulse from being applied to the defective lamp. In the case of multiple strings wired in parallel, one bulb should first be removed from each functioning section, so that no lights in the string can glow. The defective string then appears as an open circuit to the high voltage source, allowing maximum voltage to appear across the defective bulb. After the trigger has been pulled the requisite number of times, the light string is unplugged from the socket 30 and plugged into a standard AC is electrical outlet. The higher current present at the AC source can render fully conductive a malfunctioning shunt only partially repaired by the low-current, high-voltage pulses. It has been found that the combination of the high-voltage pulses and the subsequent application of sustained lower-voltage power (e.g., 110 volts) repairs a high percentage of failed bulbs with malfunctioning shunts. When a malfunctioning shunt is fixed, electrical current then flows through the failed bulb containing that shunt, causing all the bulbs in that section of the light string except the failed bulb, to become illuminated. The failed bulb can then be easily identified and replaced. In cases where bulbs were previously removed from functioning sections of the light string, they are next reinstalled, in order to make the entire light string fully functional and ready for use.

As can be seen in FIG. 1, the illustrative device also includes a second socket 33 for receiving one of the bulb sockets 34 in a light string 32. Use of a bulb socket 34 to repair a light string is often more convenient when the light string is installed in a manner that makes it difficult to locate or access the plug at the end of the string, as in prelit Christmas trees. The socket 33 contains a pair of electrical contacts that engage the same contacts that engage a bulb inserted into the string socket 34, and the contacts in the socket 33 receive the same pulses supplied to the socket 30. In this case, however, the AC plug 31 of the light string 32 remains connected to a source of AC power during the application of the high-voltage pulses. In addition, in the case of multiple paralleled light strings, application of the pulse via the light socket automatically means that the pulse is never applied to more than one of the paralleled strings at a time. It is therefore not necessary to remove bulbs from the functioning sections of the string. By using one or more rectifiers across the piezoelectric source, it is possible to initiate a series of events that allows a very high percentage of shunts to be healed in a very simple manner. The trigger 14 is pulled to apply a high voltage pulse to the bad shunt, via socket 33. The high voltage pulse then initiates conduction in that shunt. That conduction allows the AC line voltage to immediately send relatively large amounts of current through the shunt via the rectifiers, and that current permanently welds the shunt, allowing the remaining lights in the string to glow (discussed in more detail below). The use of the bulb socket connector 33 to heal shunts should be the first choice when available because it provides the highest percentage of shunts healed, and the string will begin to glow immediately when the shunt heals, thereby providing visual feedback of success. In cases where it is not possible to use the socket 33, the use of the socket 30 provides an acceptable backup method.

The tip 15 of the device shown in FIG. 1 contains a probe P connected to circuitry on a printed circuit board 16 for detecting the location of a malfunctioning bulb as the probe is moved along a light string, as described in more detail below.

Also, as will be described in more detail below, the piezoelectric device may be replaced with a pulse-generating circuit and an electrical power source. Circuitry may also be added to stretch the pulses (from any type of source) before they are applied to the light string so as to increase the time interval during which the high voltage is applied to the malfunctioning shunt.

When a bulb does not illuminate because of a bad connection in the base of the bulb, the pulse from the piezoelectric element will not fix/clear this type of problem. Bad connections in the base and other miscellaneous problems usually account for less than 20% of the overall failures of light strings.

The high-voltage pulses used to fix a malfunctioning shunt in a failed bulb may be generated by means other than the piezoelectric source described above. For example, the DC output of a battery may be converted to an AC signal that is passed through a step-up transformer to increase the voltage level, rectified and then used to charge a capacitor that discharges across a spark gap when it has accumulated a charge of the requisite magnitude. The charging and discharging of the capacitor continues as long as he AC signal continues to be supplied to the transformer. The resulting voltage pulses are applied to a light string containing a failed bulb with a malfunctioning shunt, as described above.

Figure 4:
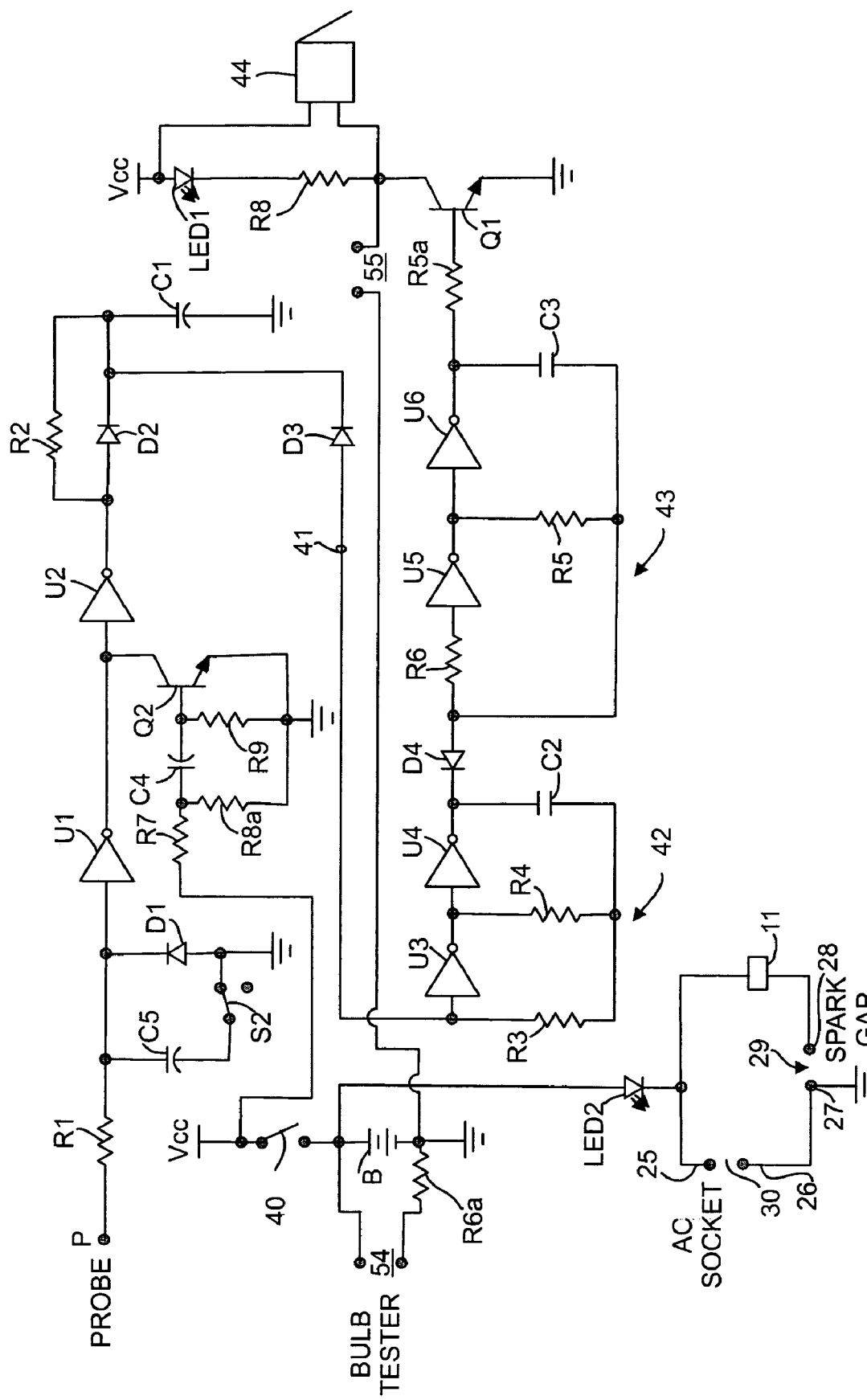
FIG. 4 is schematic circuit diagram of a piezoelectric high-voltage pulse source, dual-sensitivity electric field detector, bulb tester, and fuse tester for use in a device similar to that of FIGS. 1-3.

In a preferred electric field detection circuit illustrated in FIG. 4, a manually operated switch 40 applies power to the circuit when moved to the closed position where it connects a battery B to $V_{cc}$. In this embodiment the socket 33 is not used, and the piezoelectric device 11 connects only to the socket 30. A pair of conductors 25 and 26 lead to the socket 30 to deliver pulses from the piezoelectric device 11 to a plug 31 on the end of a light string 32. The conductor 26 may optionally be interrupted by a pulse-triggering air gap 29 formed between a pair of electrodes 27 and 28, forming an air gap having a width from about 0.20 to about 0.25 inch. The voltage output from the piezoelectric device 11 builds up across the electrodes 27, 28 until the voltage causes an arc across the gap 29. The arcing produces a sharp voltage pulse at the socket 30 connected to the conductor 26, and in a light string 32 plugged into the socket 30. The piezoelectric device 11 may be used without the spark gap 29, in which event the malfunctioning shunt itself acts as a spark gap.

A light-emitting diode LED2 serves as a continuity indicator, as described in published U.S. Patent Application Publication No. US 2004/0130331 A1.

The battery B applies a voltage $V_{cc}$ to a light-emitting diode LED1 which is then illuminated whenever it is connected to ground by a switching transistor Q1. The battery voltage $V_{cc}$ also charges a capacitor C4 through a resistor R7. As the capacitor C4 charges, it turns on a transistor Q2, which momentarily pulls low the signal line between a pair of inverters U1 and U2 described below. The transistor Q2 turns off when the capacitor C4 is fully charged. The momentary low produced during the time the transistor Q2 is on triggers a pair of oscillators also described below, causing LED1 to flash and buzzer 44 to sound for a short time to indicate that the circuit is energized, the battery is good, and the circuit is functional. As noted above, when capacitor C4 is fully charged, transistor Q2 turns off. This causes LED1 and buzzer 44 to become inactive. The detector is then ready for use. The LED and buzzer will now become active only when an electric field of adequate strength is sensed by probe P.

The probe P of the detector is connected to a resistor R1 providing a high-impedance, which in turn is connected to a high-gain inverter U1, a capacitor C5, and the cathode of a diode D1. When the probe P is adjacent a conductor connected to the hot side of an AC power source, the AC electric field surrounding the conductor induces an AC voltage in the probe. This signal is then amplified by the inverter U1. The output of the inverter U1 is fed to an inverter U2, where it is again amplified. The amplified AC signal at the output of inverter U2 is then fed to a detector formed by a diode D2, a resistor R2, and a capacitor C1. The detector produces a positive DC voltage at the junction of the capacitor C1 and the cathode of a diode D3.

In the absence of an AC signal at probe P, the voltage across the capacitor C1 s minimal, the cathode of diode D3 is nearly at ground potential, and diode D3 is turned on. The anode of the diode D3 (and the input of inverter U3) is likewise nearly at ground potential. The diode D3 therefore clamps the input of the inverter U3 to ground. With the input of inverter U3 clamped to ground, the oscillator 42, of which inverter U3 is a part, is disabled. Whenever an AC signal of sufficient strength is detected by the probe P, however, the cathode of the diode D3 is driven positive by the resulting DC voltage developed across the capacitor C1. This reverse biases the diode D3, allowing the voltage at the input of the inverter U3 to rise to the point at which an oscillator 42 can begin running.

The oscillator 42 is a low-frequency square-wave oscillator that operates at ~10 Hz and is formed by inverters U3 and U4, resistors R3 and R4 and a capacitor C2. A second oscillator 43 is a high-frequency square-wave oscillator that operates at ~2.8 kHz and is formed by inverters U5 and U6, resistors R5 and R6 and a capacitor C3. Both oscillators are conventional free-running oscillators, and the output of the low-frequency oscillator 42 gates the high-frequency oscillator 43 on and off. Consequently, the second oscillator remains on for $\frac{1}{20}^{th}$ of a second, causing a buzzer 44 to produce a 2.8 KHz tone and a light-emitting diode LED1 to glow during this period. The oscillator is then shut down for the next $\frac{1}{20}^{th}$ of a second, causing the buzzer 44 to produce no output and the LED1 to remain extinguished. Thus, the LED1 appears to the eye to blink at a 10 Hz rate, since the eye cannot perceive the 2.8 KHz flicker, and the buzzer produces bursts of 2.8 KHz tone interrupted at a 10 Hz rate. The modulated output of the high-frequency oscillator 43 drives the base of transistor Q1 via resistor R5a, turning the transistor on and off in accordance with the aforementioned modulated signal. The buzzer 44 is connected in parallel with the series combination of LED1 and a resistor R8.

To locate a failed bulb, the switch 40 is held in the closed position while the probe P is moved along the length of the light string, keeping the probe within one inch or less from the light string (the signal strength increases as the probe is moved closer to the light string). The LED1 flashes repetitively and the buzzer 44 beeps until the probe moves past the failed bulb, and then the LED1 and the buzzer 44 are de-energized as the probe passes the failed bulb, thereby indicating to the user that this is the location of the bulb to be replaced. Alternatively, the LED1 and the buzzer 44 will remain de-energized until the probe reaches the failed bulb and then become energized as the probe passes the failed bulb or other discontinuity in the light string, again indicating the location of the defect.

Depending upon the orientation of the light string's power plug in an AC socket, both the LED1 and the buzzer 44 change, either from activated to deactivated or from deactivated to activated, as the probe P moves past a failed bulb. Specifically, when the probe P approaches the failed bulb along the "hot" wire leading to that bulb, the LED1 flashes and the buzzer 44 beeps until the probe P reaches the bad bulb, at which time the LED1 is extinguished and the buzzer 44 is silenced. When the probe P approaches the failed bulb along the "cold" wire, the LED1 remains extinguished and the buzzer 44 remains silent until the probe P is adjacent the bad bulb, at which time the LED1 begins to flash and the buzzer 44 begins to beep. Thus, in either case there is a clear change in the status of both the LED1 and the buzzer 44 to indicate to the user the location of the bad bulb.

Another advantage of this detection system is that the automatic continuous pulsing of the LED1 and the buzzer 44 provides both visual and audible feedback signals to the user that enable the user to judge the optimum distance between the detector and the light string being scanned. The user can move the detector toward and away from the light string while observing the LED1 and listening to the buzzer to determine the distance at which the visual and audible signals repeat consistently at regular intervals.

To permit the sensitivity of the detector circuit to be reduced, a switch S2 permits a capacitor C5 to be connected to ground from a point between the resistor R1 and the inverter U1. This sensitivity adjustment is desirable because in the presence of a strong electric field from a nearby light string, the LED1 may continue to flash and give false readings.

The housing of FIGS. 1-3 may be modified to accommodate the specific type of circuitry used. When the housing is used with the circuit of FIG. 4, for example, one of its modifications is the removal of the socket 33. The piezoelectric device 11 connects only to the single socket 30.

Figure 5:
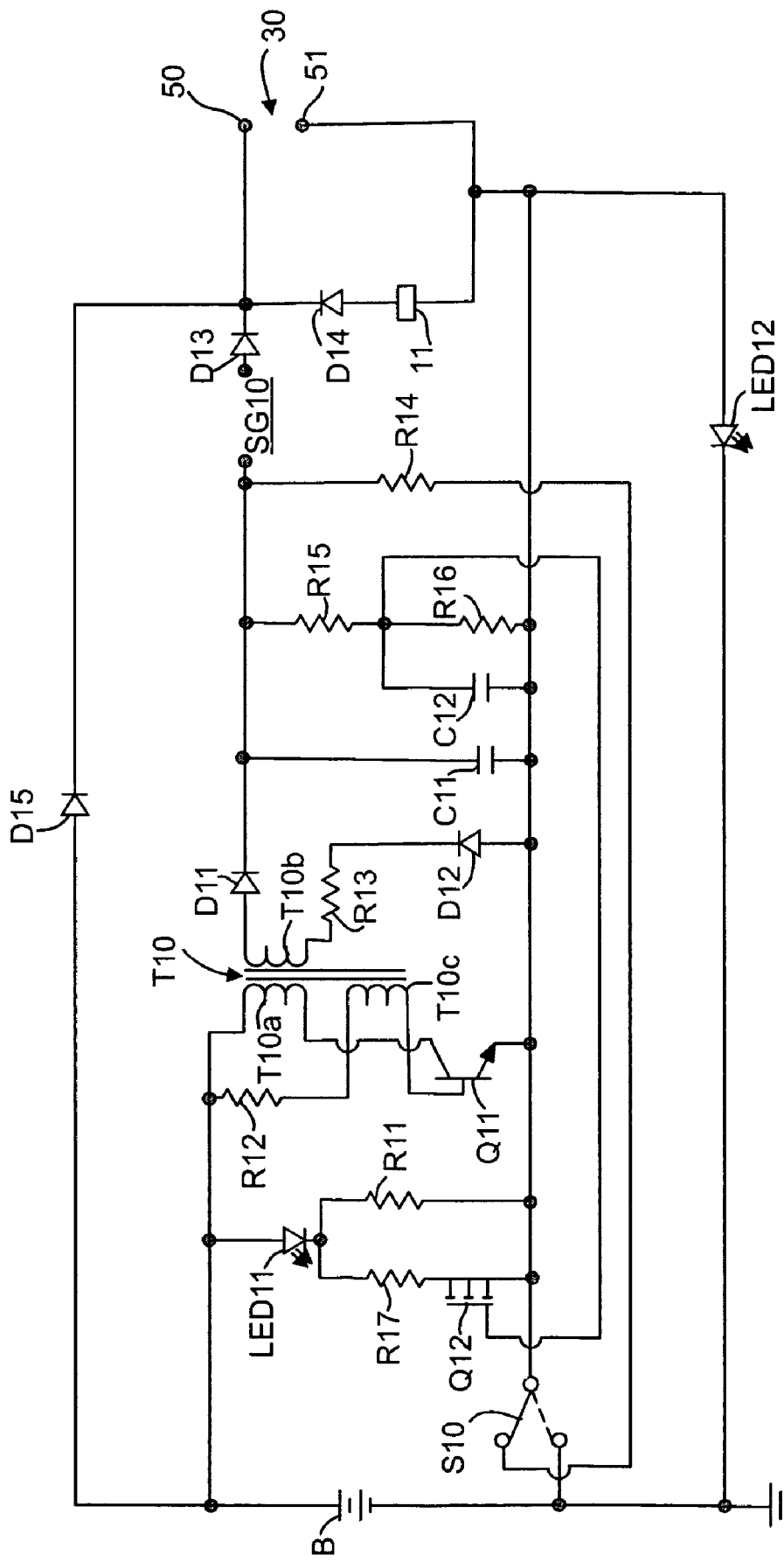
FIG. 5 is a schematic diagram of a battery-powered circuit for generating high-voltage pulses in a device similar to that of FIGS. 1-3.

FIG. 5 illustrates a battery-powered circuit for generating high-voltage pulses that may be used independently of, or in combination with, the piezoelectric device 11. The illustrative circuit includes the piezoelectric pulse generator 11 described above, for producing high-voltage pulses across a failed bulb in a light string connected across terminals 50 and 51 in the socket 30. The diodes D13, D14, and D15 isolate the piezoelectric device 11 from the rest of the circuit, which forms a second high-voltage pulse source powered by a battery B.

Before describing the pulse-generating circuit in FIG. 5, the overall sequence of operations for troubleshooting an extinguished light string will be described. The battery-powered pulse is produced by simply pressing a switch S10 and holding it down until a light-emitting diode LED11 glows brightly, indicating that a capacitor C11 has been fully charged. A pulse from the piezoelectric device 11 is produced by pulling the trigger 14 (shown in FIG. 1) one or more times. If either type of pulse fixes a malfunctioning shunt in a failed bulb, a light-emitting diode LED12 is illuminated. If either type of pulse by itself does not fix a malfunctioning shunt, the two pulses can be generated concurrently, which will fix certain shunts that cannot be fixed by either pulse alone.

In general, there are four types of bulbs encountered in actual practice. First, there are bulbs in which the shunt will be fixed by either type of pulse by itself, and thus either the battery-powered pulse or the piezoelectric pulse may be used for this purpose. Second, there are bulbs in which the shunt can be fixed only with the higher-energy pulse produced by concurrent generation of both the battery-powered pulse and the piezoelectric pulse. Third, there are bulbs in which the shunt cannot be fixed, but the failed bulb will glow when the battery-powered circuit constantly applies a high voltage to the bulb, the switch S10 being held down until the glowing bulb is visually detected. Fourth, there are bulbs that will not glow, but will blink or flash in response to the higher-energy pulse produced by concurrent generation of both the battery-powered pulse and the piezoelectric pulse. This pulse can be repeated until the defective bulb is detected by visually observing its flash.

Returning now to FIG. 5, when the pulse from the piezoelectric device 11 fixes the malfunctioning shunt, the LED12 is illuminated by current flowing from the battery B through a diode D15, the light string connected to terminals 50 and 51, and the LED12 to ground. The diode D15 protects the remaining circuitry from the high-voltage pulses produced by the piezoelectric device 11. If the shunt is still not conductive after being pulsed by the piezoelectric device 11, current does not flow through the light string and thus the LED12 remains extinguished. Thus, LED12 acts as a continuity indicator to provide the user with a visible indication of whether the malfunctioning shunt in the light string has been fixed.

The balance of the circuit shown in FIG. 5 generates the battery-powered, high-voltage pulse. The switch S10 is pressed to connect the battery (or batteries) B to a conventional ringing choke converter or blocking oscillator operating at a relatively low frequency, e.g., 6.5 kHz, under nominal load. The oscillator converts the 3-volt d-c. output of the battery B to an AC signal that is supplied to the primary winding T10a of a step-up transformer T10. The stepped-up voltage from the secondary winding T10b, which may be hundreds or even thousands of volts AC, is rectified by a pair of diodes D11 and D12 and then stored in the capacitor C11, charging the capacitor C11 to greater than 500 volts. The stored energy is: $E_s = \frac{1}{2} CV^2$ where C=0.33 uF and V=500V. Thus $E_s$=0.04125 joules.

As it may take several seconds for the capacitor C11 to fully charge, the light-emitting diode LED11 indicates when the proper charge has been established. As the voltage on C11 reaches its maximum value, a voltage divider formed by a pair of resistors R15 and R16 starts to bias "on" an N-channel MOSFET Q12. (The resistors R15 and R16 also provide a leakage path for the capacitor C11.) The LED1 increases in brightness as the Vg-s threshold of the MOSFET Q12 is reached and continues to become brighter as the Vg-s increases. A capacitor C12 is charged through the resistor R15 and provides a time delay to ensure a full charge on the capacitor C11. The series combination of the MOSFET Q12 and a resistor R17 is in parallel with the resistor R11 and thus lowers the total resistance in series with LED11 when the MOSFET Q12 conducts, thereby increasing the current through LED11 to make it glow brighter. The resistor R17 serves as a current-limiting resistor while Q12 is conducting. When the output of the LED11 reaches constant brightness, the output voltage is at its maximum.

When the charge on the capacitor C11 builds up to a threshold level, e.g., 500 volts, it reaches the firing voltage of a gas-filled, ceramic spark gap SG10, thereby applying the voltage to the failed bulb in the light string, producing a partial breakdown of the dielectric material in the malfunctioning shunt and reducing the intensity of LED11.

If LED12 is not illuminated, the switch S10 is held in the depressed position, which causes the charging and discharging cycle to repeat. This is continued for as long as S10 is depressed. If LED12 is still not illuminated, the user pulls the trigger 14 the next time the LED11 reaches maximum brightness. This produces concurrent pulses from both the piezoelectric device 11 and the battery-powered circuit. When the device is turned off, any remaining charge on the capacitor C11 is discharged through a resistor R14 via the normally-closed contacts of switch S10.

The high-voltage pulse from the piezoelectric device produces an arc across the dielectric material in the defective shunt causing current to flow. The energy stored in C11 then causes the shunt to be permanently repaired, illuminating LED12. If LED12 is not illuminated, the trigger 14 shown in FIG. 1 may be pulled several more times to produce additional pulses. If LED12 is still not illuminated, the user may proceed to the detection modes to attempt to identify the failed bulb or other defect, so that the bulb can be replaced or the other defect repaired.

A first detection mode causes a failed bulb to glow by supplying the light string with the pulse from only the battery-powered circuit, independently of the piezoelectric device 11, by again depressing the switch S10. Again the pulse-triggering device breaks down when the voltage builds up to a threshold level, and then a high voltage will be continually applied to the failed bulb or other discontinuity as long as the switch is held down. This causes a failed bulb of the third type described above to glow, so that it can be visually identified and replaced.

A second detection mode causes a failed bulb to flash by generating concurrent pulses from the piezoelectric device 11 and the battery-powered circuit. As described previously, this combined pulse is produced by pressing switch S10 until LED11 illuminates brightly, and then pulling the trigger 14 to activate the piezoelectric device 11. This causes a failed bulb of the fourth type described above to flash, so that it can be visually identified and replaced.

The circuit of FIG. 5 permits the user to quickly locate and replace a failed bulb without attempting to fix the shunt associated with that bulb, or the user can first attempt to fix a malfunctioning shunt with high-voltage pulses from either or both of two different sources. If the user does not see a bulb glow or flash the first time a pulse is generated, the pulses may be repeated until a glow or flash is detected.

If desired, the output voltage of the battery-powered circuit can be increased by increasing the turns ratio between the secondary and primary windings of the step-up transformer T10. Also, the circuit parameters may be selected so that the gas-filled spark gap or other triggering device does not break down until the piezoelectric device 11 is also triggered.

Figure 6:
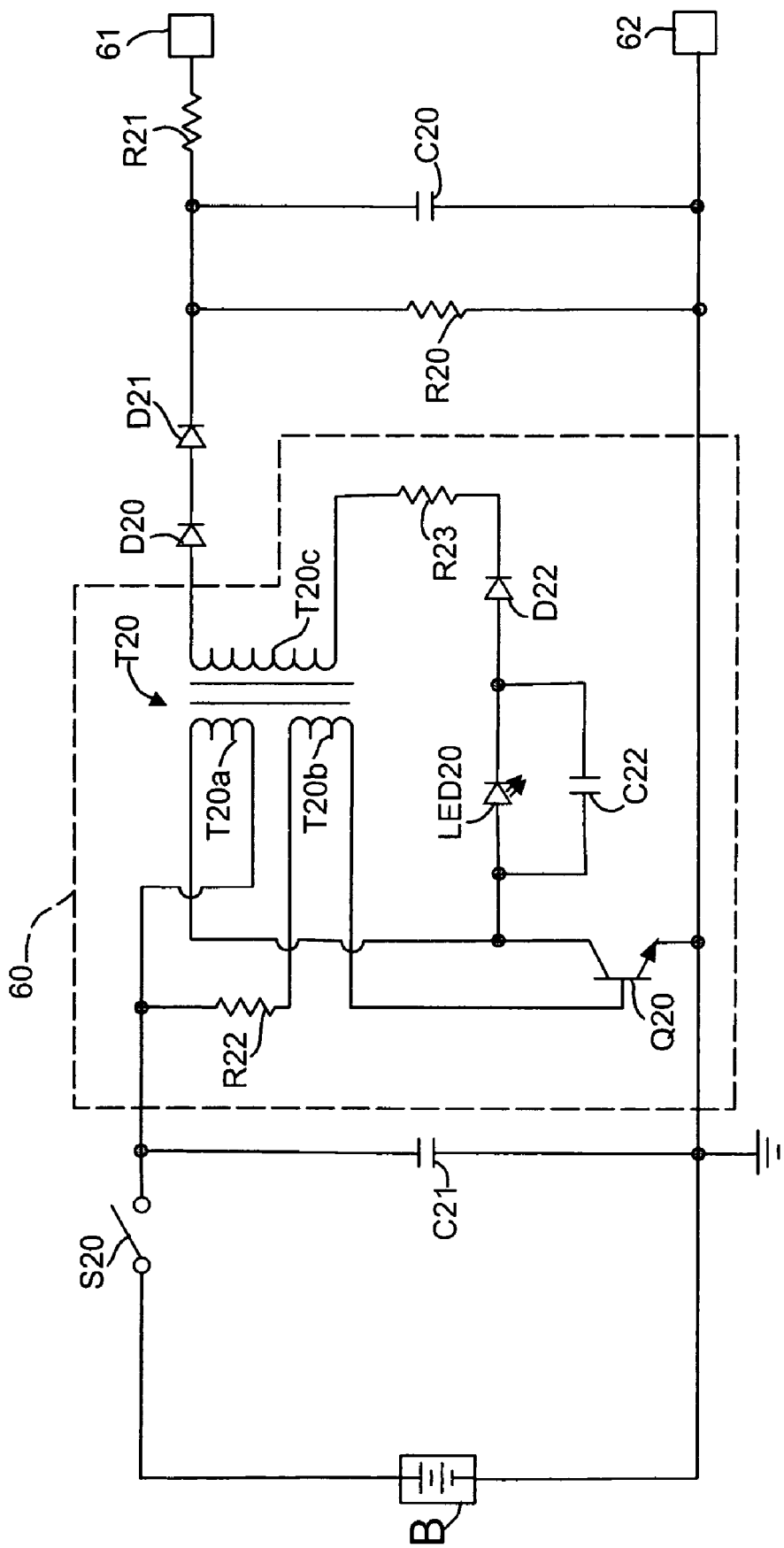
FIG. 6 is a schematic diagram of another battery-powered circuit for generating high-voltage pulses in a device similar to that of FIGS. 1-3.

Referring now to FIG. 6, an alternative circuit for fixing failed shunts includes a battery B that supplies DC power to a blocking oscillator 60 to generate a high-voltage AC signal that is rectified by a pair of diodes D20 and D21. This in turn produces a high-voltage DC signal that charges a capacitor C20. A high-impedance resistor R20 acts as a safety bleeder across the capacitor C20. A current-limiting resistor R21 connects the stepped-up, rectified signal with an output terminal 61, and a second output terminal 62 is connected to circuit ground. The light string is connected to the terminals 61 and 62 for repair.

Operation of the oscillator circuit 60 is initiated by closing a switch S20 which supplies power across a capacitor C21 to the primary winding T20a of a high frequency step-up transformer T20, and to an auxiliary winding T20b through a current-limiting resistor R22. A transistor Q20 has its collector and base connected to the primary windings T20a and T20b, respectively. The oscillator circuit 60 operates as a blocking oscillator producing a flyback effect in the transformer T20, thus producing a stepped-up AC signal in the secondary winding T20c. A feedback circuit is applied to the collector of the transistor Q20 from the secondary winding of the transformer T20 through a current-limiting resistor R23 and a rectifier diode D22, which also turns on a light-emitting diode LED20 when the oscillator circuit 60 is operative. A capacitor C22 across the LED20 protects and reduces the peak energy applied to the LED20.

Figure 7:
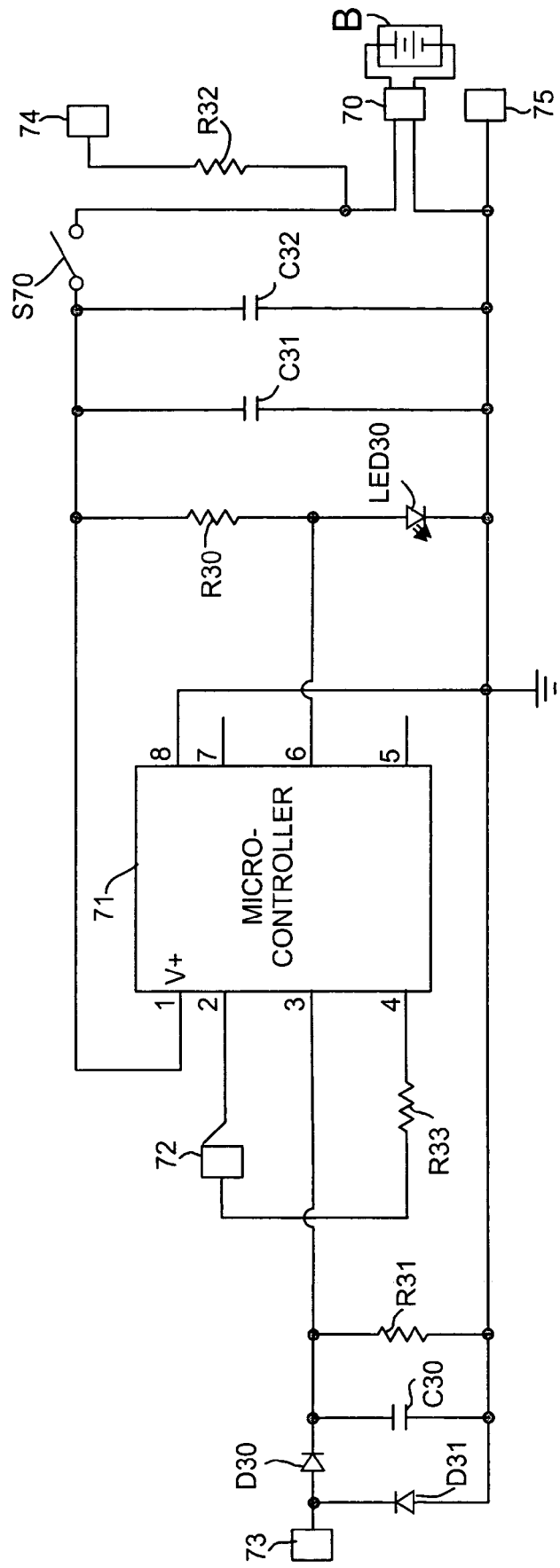
FIG. 7 is a schematic diagram of an electronic circuit for identifying the location of a malfunctioning bulb in a light string.

Referring now to FIG. 7, a schematic diagram of another electronic circuit for identifying the location of a failed bulb in a light string is illustrated. The positive and negative terminals of a battery B are connected to pins 1 and 2, respectively, of a connector 70. The battery supplies power to the circuit when a single pole switch S70 is closed. A microcontroller 71, such as a PIC12F675 available from Microchip Technology, is used to perform electric field detection and also to control an LED indicator LED30. The LED30 is powered on through a resistor R30. The voltage developed across LED30 is used as a precision low voltage reference by the analog-to-digital (A/D) converter section in the microcontroller 71. The microcontroller 71 controls a beeper or buzzer 72 via resistor R33 in a programmable fashion.

An electric field probe circuit includes an antenna connected to a terminal 73. The terminal 73 is also connected to a voltage doubling circuit formed by switching diodes D30 and D31. The switching diodes D30 and D31 charge a capacitor C30 which is slowly discharged by a high-impedance resistor R31. A filter time constant is set by the resistor R31 and the capacitor C30. The capacitor C30 provides stable and reliable operation over a fixed range of distances between the probe and the wires of the light string.

When the antenna/probe at terminal 73 is adjacent a conductor connected to the hot side of an AC power source, the electric field surrounding the conductor induces an AC signal in the probe. The microcontroller 71 monitors the probe voltage with the built-in A/D converter. The AC signal in the probe is sampled hundreds of times a second and is averaged to obtain a solid count value. As the operator moves the probe along the light string there are perturbations caused by twists in the light string and protruding light bulbs. These perturbations can be averaged out and not cause a false detection by using a long time constant. Once a definite change is detected, the averaged value slowly settles into a new value and the beeper is shut off. Then the operator can reverse motion and move at a slower rate and find the transition point where the beeper sounds again. At this point the burned out bulb in question is detected.

When the switch S70 is closed, a pair of parallel bypass capacitors C31 and C32 appear in parallel with the battery B. The two capacitors C31 and C32 provide a low-impedance return path to ground for electrical noise on the DC power pin of the microcontroller 71. The capacitor C32 is preferably a 100-µfd electrolytic capacitor for lower frequencies, while the second capacitor C31 is a 0.1-µfd regular capacitor to bypass the higher frequencies.

A pair of bulb testing contacts 74 and 75 and a current-limiting resistor R32 are also shown. A bulb is tested by making electrical contact between the wire leads of the bulb base and the contacts 74 and 75.

Figure 8:
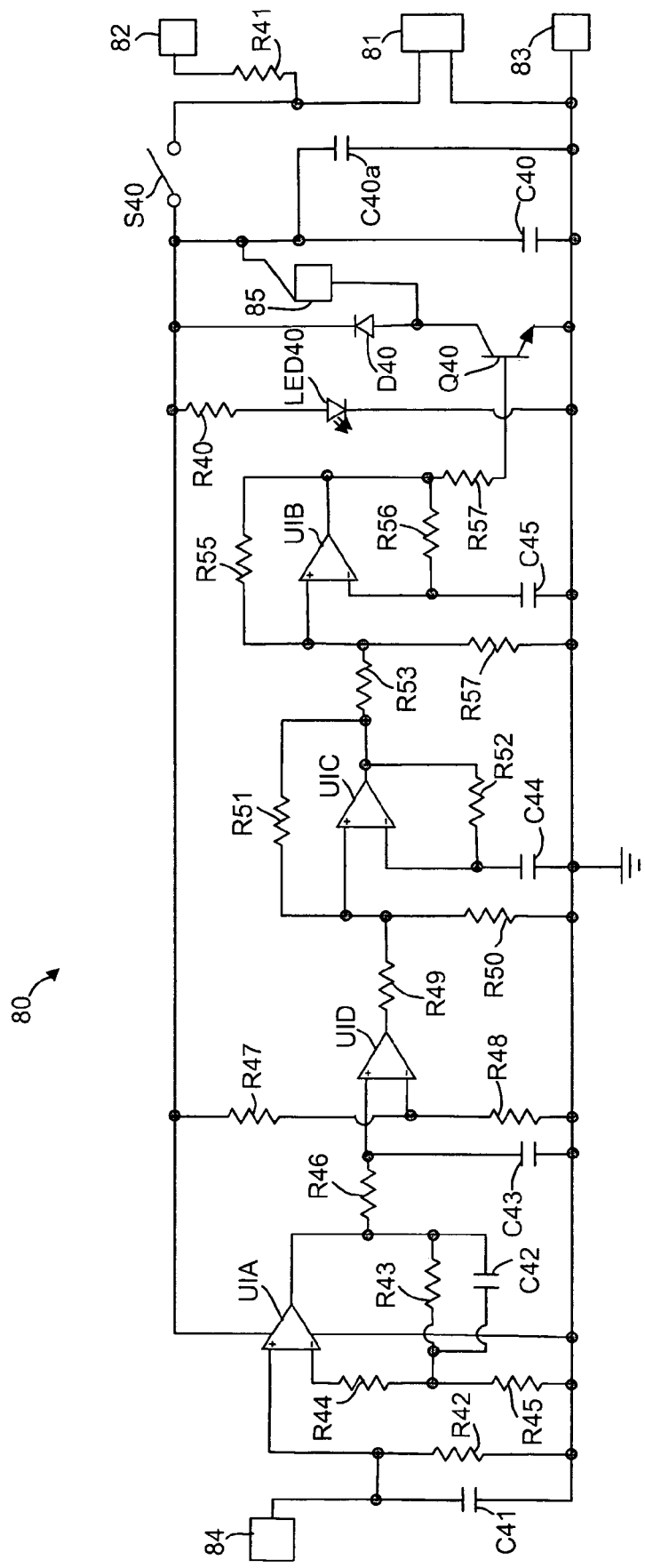
FIG. 8 is a schematic diagram of another electronic circuit for identifying the location of a malfunctioning bulb in a light string.

Referring now to FIG. 8, an electric field detection circuit 80, such as is used to detect an electric field in a string of decorative Christmas tree lamps, is illustrated. The circuit 80 is powered by three 1.5-volt batteries (not shown) connected across the terminals of a connector 81. An electrolytic capacitor C40, in parallel with a high frequency bypass capacitor C40a, provides battery bypassing at both low and high frequencies, thereby keeping electrical noise on the power leads at a minimum. The capacitors C40 and C40a are charged when an SPST switch S40 is closed, providing connectivity with the batteries (not shown) at the terminals of the connector 81. When the circuit 80 is powered, a current-limiting resistor R40 supplies a voltage to illuminate LED40. An unswitched bulb-testing interface is provided across a pair of termninals 82 and 83, and is directly powered by the batteries connected at the terminals of the connector 81, through a current-limiting resistor R41.

A small 1-2 inch wire antenna is connected to a terminal 84, along with a capacitor C41 that acts as a high frequency filter. When the antenna comes into proximity with an electric field, a voltage is induced across a high impedance load resistor R42. According to one embodiment, a quad op-amp integrated circuit can be used to provide four independent op-amp circuits, U1A, U1B, U1C and U1D, all of which are used in the illustrative circuit 80. The antenna voltage appearing across the resistor R42 is fed to the non-inverting input of the op amp U1A, which is configured as a non-inverting amplifier. A capacitor C42, which is in parallel with a feedback resistor R43, provides further low pass filtering on the received signal. Capacitor C42 and resistors R43 and R45 set the gain of the amplifier, while resistor R44 minimizes the error caused by the DC input bias currents of the op amp U1A.

Because of the DC biasing of the op amp U1A, when a 60-Hz or 50-Hz sine wave appears at its input, only the positive halves of that sine wave will appear at its output. In other words, the op amp U1A both amplifies and performs half-wave rectification upon the input signal.

The circuit containing the op amp U1A in FIG. 8 generates maximum gain at DC. It is therefore preferred to choose an op-amp with very small DC offset voltages and offset currents so as to prevent these factors from producing significant DC error at the output. The circuit is also adversely affected by changes in battery voltage as the batteries discharge. A modified version of this circuit, described below in connection with FIG. 9, allows the use of inexpensive op amps and is more tolerant to changes in battery voltage.

The output signal from the op amp U1A is filtered through a current-limiting resistor R46 and a capacitor C43, which converts the half-wave output signal to a DC value with a time constant set by the values chosen for resistor R46 and capacitor C43 (about 320 milliseconds). The DC output signal is received by the op amp U1D, which is configured as a voltage comparator by resistors R47 and R48. The resistors R47 and R48 set a voltage output that determines the sensitivity of the circuit.

The output signal of the op amp U1D is then received by the first of two relaxation oscillator stages using the remaining op amps U1C and U1B, to produce a modified square wave signal in the presence of a DC voltage. When the output of the op amp U1D goes high, the voltage divider consisting of resistors R49, R50 and R51 biases the U1C oscillator into its active region. The oscillator will then begin to run. The op amp U1C is configured to produce a low frequency square wave of about 10 Hz, as determined by resistors R49, R50 and R51, and a time constant determined by a negative feedback resistor R52 and a capacitor C44.

The low frequency signal at the output of the U1C oscillator cycles on and off a second oscillator stage containing the op amp U1B. The U1B oscillator stage is configured to produce a higher frequency square wave (of about 2.8 KHz) as determined by resistors R53, R55 and R57 and a time constant determined by a negative feedback resistor R56 and a capacitor C45.

The resulting gated square wave signal from the U1B oscillator stage drives the base of a transistor Q40, through a resistor R57, and the transistor Q40 in turn drives a buzzer 85, producing an audible signal. A diode D40, such as a 1N4148, prevents the interference spikes from the buzzer 85 from being conducted through the circuit 80. The diode D40 also protects the collector of the transistor Q40 from the higher-voltage switching transients generated by the inductance present in the buzzer 85.

According to one embodiment, the output tone of the buzzer 85 is a distinctive warbled tone (2.8 KHz) as determined by the two serial oscillator stages of the op amps U1C and U1B. According to another embodiment, the output tone of the buzzer 85 is a simpler tone as determined by a single oscillator stage.

In a dual-antenna modification of the circuit of FIG. 8, either or both of two antennas connected to the terminal 84 acquire sufficient signal to operate the detector when in the scan mode. Additionally, when the antennas are placed on opposite sides of a malfunctioning bulb and moved from side to side so that the antennas alternately come into contact with the test locations of the bulb, the buzzer 85 will change from activated to deactivated or vice versa, depending upon whether there is AC present at that bulb terminal. This change indicates either the presence of a failed bulb whose shunt has not activated or a failure in the wiring or socket at that location. This mode of operation is further described below.

Figure 9:
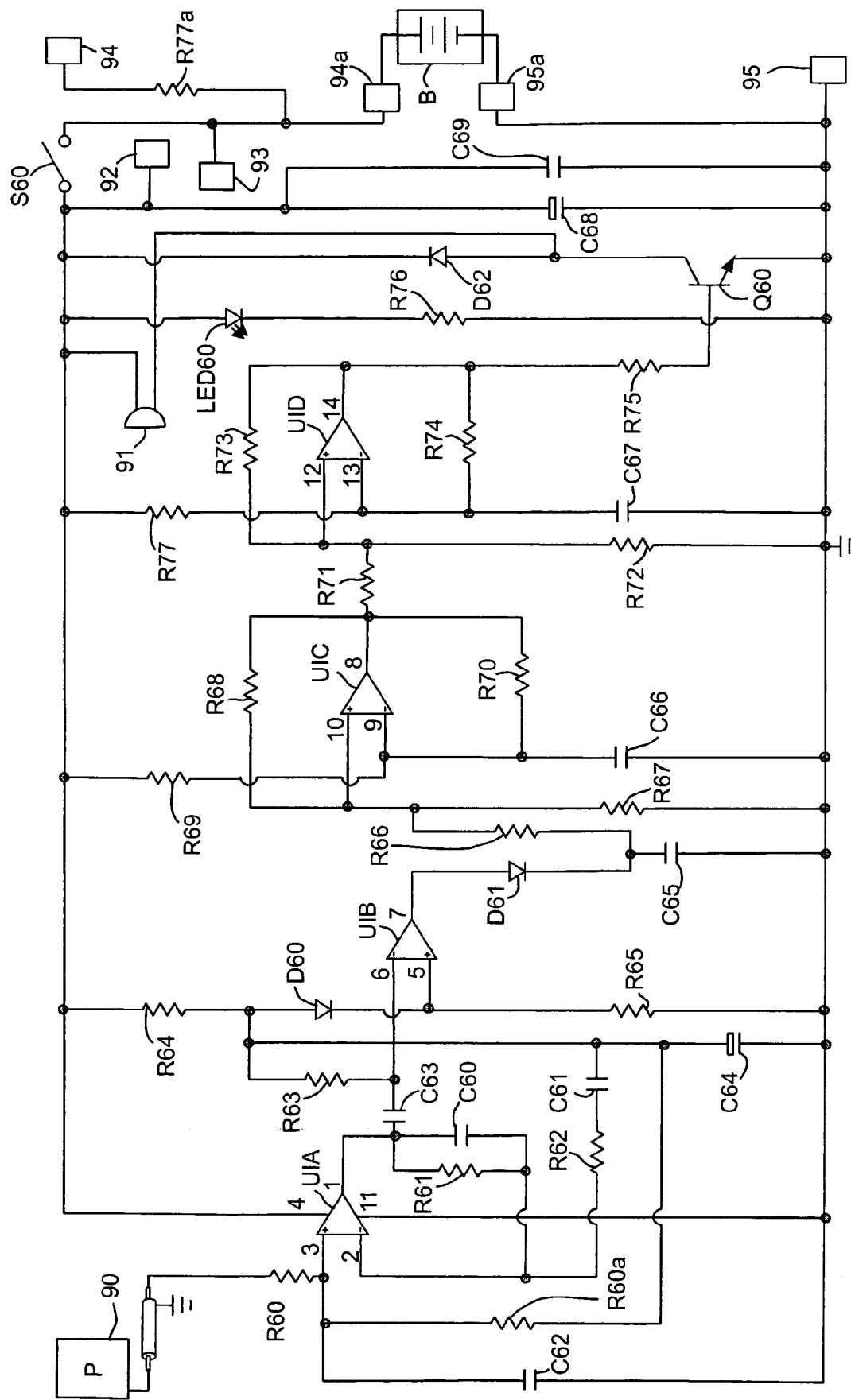
FIG. 9 is a schematic diagram of another electronic circuit for identifying the location of a malfunctioning bulb in a light string.

FIG. 9 illustrates an embodiment that again utilizes four op amps U1A-U1D, which are commercially available in a single, low-cost integrated circuit such as an LM324. FIG. 9 is an improved version of FIG. 8. It uses an AC-coupled amplifier in order to minimize the detrimental effects of the relatively high DC offset currents and voltages common in low-cost op amps such as the LM324. Although the voltage gain of the amplifier stage employing the op amp U1A can be approximately 50 at 60 Hz, the gain at DC has been reduced to zero, so that DC errors are eliminated. Power is typically supplied by three batteries B connected to terminals 94a and 95a, between an on-off switch S60 and ground. A pair of capacitors C68 and C69 provide respective low-frequency and high-frequency bypass paths.

The signal from an antenna 90 is applied through a resistor R60 to the input pin 3 of the first op amp U1A. The lead-in wire from the antenna 90 is shielded to allow the signal to be picked up only at those precise areas at which it is desired to sense. The shield keeps out stray signals and also helps make the detector more immune to the effects of handling the tool containing the antenna and circuit, such as the proximity of the user's hand interfering with proper pick-up.

The op amp U1A is connected as a non-inverting amplifier having a voltage gain from pin 3 to pin 1 of $1+Zf/Zi=1+\{1/(1/R61+j\omega C60)\}/(R62+1/j\omega C61)$. The components R61-C60, R62-C61, R60-C62 and R63-C63 actually serve three separate purposes:

They fix the gain of the op amp U1A at 60 Hz (or 50 Hz) to the value desired for proper operation.

They form a bandpass filter to prevent unwanted signals of higher and lower frequencies from being passed on to the detector, thereby causing false responses.

The RC combinations of the resistor R62 and the capacitor C61, and the resistor R63 and the capacitor C63, roll off the voltage gain to zero at DC in order to block the unwanted effects produced by the DC offset voltages and currents at the inverting and non-inverting inputs of the op amp U1A. The gain of the op amp U1A from pin 3 to pin 1 is $(1+Z_f/Z_i)$, where the parallel combination of the resistor R61 and the capacitor C60 constitutes $Z_f$, and the series combination of the resistor R62 and the capacitor C61 constitutes Zi. As the frequency approaches 0 Hz, $Z_i$ approaches ∞ and $Z_f$ approaches the value of R61, typically 2 megohms. Therefore $\lim_{f \to 0} (1+Z_f/Z_i)=1$. The reduction in DC voltage gain to one ensures that DC offsets at the inputs will not be amplified to the point that they drive the output of the op amp U1A into non-linear operation. The offset errors, though greatly reduced (e.g., by a factor of 50), still are present at the output pin 1 of the op amp U1A, and thus can still contribute some error to the detector. Therefore the capacitor C63 is used to block DC altogether, reducing DC offset errors from the op amp U1A to zero.

The open-loop voltage gain of the op amp U1A is about 100,000. The closed-loop voltage gain is only about 50. Thus 99.95% of the gain is fed back as negative feedback, which provides the amplifier with the following advantages:

Changes in voltage gain due to op-amp tolerances, power-supply voltage variations, temperature variations and many other sources are insignificant.

THD (Total Harmonic Distortion) is insignificant.

Input impedance is raised due to the bootstrapping effect of the negative feedback signal at the inverting input of the op amp.

Output impedance is reduced.

In effect, the characteristics of the amplifier stage are dependent on the associated impedances R61-C60, R62-C61, R60-C62, and R63-C63, and not on the op amp. The variation in gain depends almost completely on the tolerances of the various capacitors and resistors used to determine that gain. The signal from the antenna 90 is amplified to about 1 volt peak-to-peak by the stable amplifier stage, and this amplifier output signal is applied through the capacitor C63 to the inverting input (pin 6) of the second op amp U1B. This second op amp is used as a comparator circuit that activates a beeper/output device 91 whenever the magnitude of the signal at the inverting input of U1B rises above a predetermined threshold, e.g., about one volt peak-to-peak, or 0.5V peak. Below that threshold the beeper/output circuit is fully disabled, and above the threshold the beeper/output circuit is fully activated. Because the inverting and non-inverting inputs of the op amp U1B are internally well matched, the op amp is capable of comparing the output of the first amplifier stage with a threshold level, without introducing error of its own.

A resistor R64, a diode D60 and a resistor R65 form a divider that performs multiple functions. First, it establishes a DC bias across a capacitor C64. This bias is applied via resistor R60a to the non-inverting input of the input-stage op amp U1A and acts as an artificial ground, allowing the op amp U1A to operate within the confines of its linear region. Second, it establishes a bias across the diode D60. This bias is applied through a resistor R63 to the inverting input (pin 6) of the op amp U1B. The diode drop thus appears across pins 6 and 5 of the op amp U1B. Current through the divider network is preferably chosen to guarantee a drop across the diode D60 of about 0.5V. As long as the peak AC signal from the capacitor C63 has a magnitude less than 0.5V, the DC bias between pins 6 and 5 will always be present, and the output (pin 7) of the op amp U1B will remain low. If the peak AC signal magnitude exceeds 0.5V during portions of its cycle, the bias will disappear, and the output of the op amp U1B will swing high. Due to the large gain of the op amp, even a slight increase over 0.5V will turn U1B fully on. The primary function of the diode D60 is to provide a stable 0.5V level, which sets the squelch point of the detector.

The voltage-current characteristic of a diode is $I=I_0(e^{V/\eta V_T}-1)$, where I is the current in amps, V is the diode terminal voltage in volts, Io is the reverse saturation current in amperes, $\eta$ is a constant, and $V_t$ is a temperature-dependent constant called the temperature equivalent voltage. The constant $\eta$ is normally about 2 for silicon diodes, and $V_t$=26 mV at room temperature. When the diode is forward biased with a V of about 250 mV or more, the approximate equation $I=I_0 e^{V/\eta V_T}$ is valid. Solving for the diode voltage V yields $V=\eta V_t \ln(I/I_0)=\eta V_t\{\ln(I)-\ln(I_0)\}$. It can thus be seen that the diode voltage varies according to the natural logarithm of diode current, which means that large changes in diode current produce only small changes in diode voltage. With new batteries having an operating voltage of 4.6 v, the current $I_H$ of the diode D60 has been found to be about 187 uA. With weak batteries having an operating voltage of 3.0V the current $I_L$ has been found to be about 114 uA. At room temperature, $I_0$ of the diode is typically 25 nA. The ratio of the diode voltage $V_H$ at 4.6V to the diode voltage $V_L$ at 3.0V is $V_H/V_L=\{\eta V_t \ln(I_H/I_o)\}/\{\eta V_t \ln(I_L/I_o)\}=\ln(I_H/I_o)/\ln(I_L/I_o)=1.059$, corresponding to a battery voltage ratio of 4.6V/3 V=1.53. It can thus be seen that a 53% change in battery voltage causes a change in diode voltage only 5.9%. This means the that circuit of FIG. 9 is nearly nine times more immune than that of FIG. 8 to changes in sensitivity due to battery voltage variation. The diode D60 therefore maintains a relatively constant voltage of about 0.5V over the wide range of diode currents caused by the inherently wide variation in battery voltage, thereby regulating the squelch point (and detector sensitivity) against changes in power supply voltage.

When the squelch level of the op amp U1B is exceeded, its output at pin 7 goes high. A diode D61 and a capacitor C65 convert that output to a positive DC voltage that is used to enable the following circuitry. When the capacitor C65 charges up in response to a high output from the op amp U1B, a portion of that bias is applied via a divider network formed by resistors R66, R67 and R68 to the non-inverting input (pin 10) of the third op amp U1C. The bias activates an astable multivibrator (which contains the op amp U1C) which then generates a square wave output signal of about 10 Hz at the output of the op amp U1C (pin 8). The op amp U1C is configured to produce a low frequency square wave, whose frequency is determined by resistors R66, R67, and R68, and by the time constant produced by a negative feedback resistor R70 and a capacitor C66. A resistor R69, connected between the positive battery voltage and the inverting input (pin 9) of the op amp U1C, maintains a small positive bias voltage on the inverting input at all times to keep the output pin 8 at ground whenever the multivibrator is off.

The 10-Hz square wave gates on and off a similar multivibrator containing the fourth op amp U1D. The second multivibrator produces an output signal of about 3 KHz which is toggled on and off at the aforementioned 10-Hz rate. The frequency of the second multivibrator is determined by the values of resistors R71, R72 and R73, and by the time constant produced by a negative feedback resistor R74 and a capacitor C67. The high gain and excellent power-supply rejection ratio of the op amp provide good stability. The frequency is almost totally dependent on the external passive resistors and capacitors, and not on the op amp itself. A resistor R77 serves the same function for the op amp U1D as resistor R69 serves for op amp U1C, as described above.

The 3-KHz output of the second multivibrator drives the base of a transistor Q60, which in turn drives the output device 91. Because the output device 91 can generate large voltage transients during its operation, a diode D62 is connected across that output device. The diode acts as a snubber to quench spikes generated by the output device during its operation, thereby protecting the transistor Q60. Fuse testing capability is provided at terminals 92 and 93. These terminals are connected directly across a detector activation switch S60. When a good fuse is shorted across the two test terminals, a light-emitting diode LED60 glows, indicating a good fuse. A current-limiting resistor R76 is connected in series with LED60.

Bulb testing capability is similarly provided at terminals 94 and 95. When a good bulb is inserted between the terminals, it will glow. A resistor R77a provides current limiting to establish a suitable brightness level. The resistor R77a also helps protect the battery in the event that a bulb with an activated shunt is inserted, which would otherwise appear as a short across the battery terminals.

The op amp-based circuit of FIG. 9 described above provides improved amplification, stability over temperature and voltage fluctuations, and consistent performance from unit to unit. Specific advantages include:

- Operation that is nearly identical from unit to unit, and virtually unchanging over temperature and battery life. The negative-feedback circuit described is typically 10 times more immune to error from the above sources than are circuits not employing such feedback.
- The use of a lower input impedance means the lead-in from the antenna can be easily shielded without having the shield capacitance kill part of the signal.
- The use of a lower input impedance also makes the unit less prone to problems caused by hand capacitance and condensation inside the unit.
- A variety of antennas both large and small can therefore be used, each specialized for detecting in a particular environment. For example, one type of antenna might work best for detecting wires, while another might be better for detecting bulbs directly.
- Multiple antennas can be used to perform detection.

Figure 10:
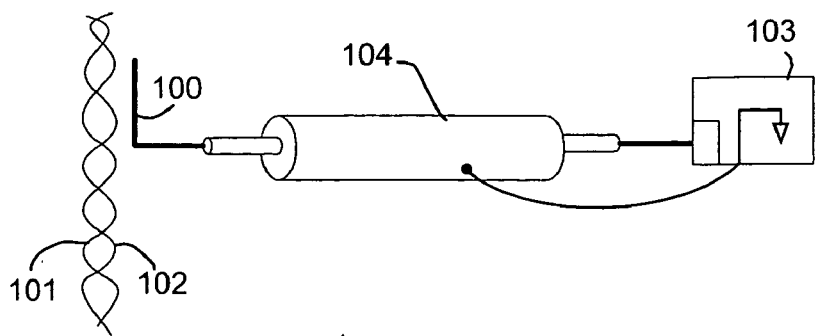
FIGS. 10-13 are diagrammatic illustrations of different antennas for use with several types of electric field detectors.

The circuit described above uses an antenna 90 tailored to tracing E fields along the wires that interconnect the individual bulbs of light strings. As illustrated in FIG. 10, an appropriate antenna consists of one or two inches of wire 100 oriented to be parallel to the wires being sensed and connected to a detection circuit 103 by a shielded conductor 104. The light strings being sensed typically have multiple wires 101, 102 running along their length. The longer antenna length helps minimize the effects of the shielding that often occur when a wire not being sensed lies physically between the antenna and a wire that is being sensed.

In Christmas trees it is frequently not possible to trace the wires interconnecting bulbs, as those wires are frequently hidden or tucked out of the way. Furthermore, the lights and wires of a Christmas tree tend to be concentrated near each other, and the field from one light or wire may bleed over into the field of another light or wire. The conductive frames in artificial trees often make the bleed-over even worse. In such cases it is preferred to sense the bulb itself or the socket in which it resides. Power supplied from the electrical mains to a light string will normally have one side hot at 120V and the other side grounded. Under these circumstances, where there is a single blown bulb, one connection to that bulb will carry 120V and its attendant E field, while the other connection to the bulb will have no voltage or E field present, other than stray fields from other sources. Therefore, a defective bulb will radiate a strong field from one side while the opposite side will have a relatively weak field present.

Several methods can be used to directly isolate the defective bulb in light strings connecting to the power mains. Regardless of the antenna used, the following factors affect the performance of the detection system:

1. Coupling should be tight. Unlike the wire sensing method described above, the area to be sensed on a bulb/socket is very small. The electric field strength falls off rapidly with distance from that area of the bulb/socket. Very soon it merges into the composite of background fields from other sources and becomes indistinguishable from those sources.

2. The antenna must be kept physically small. The more surface area the actual antenna possesses, the more energy it will pick up from interfering sources.

3. The antenna must maximize pick up from the desired source while minimizing pick up from all other sources. This generally determines the shape, size, etc. of the antenna needed.

Figure 11:
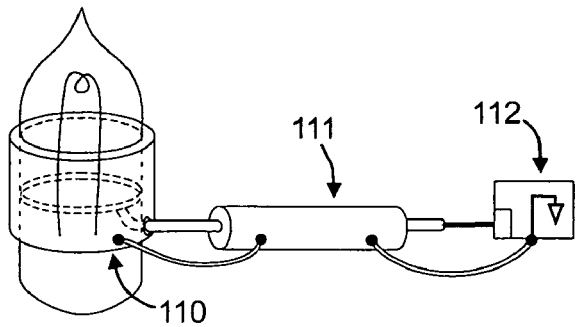

The following are examples of antennas that satisfy the above criteria:

FIG. 11 illustrates an averaging ring antenna that uses a shielded antenna 110 in the shape of a cylindrical sleeve surrounding the bulb or socket in question. On the inside of the cylinder midway down is a small electrically conductive ring, which picks up the electric field of the bulb under test. The entire outside surface of the cylinder is electrically conductive, and acts as a shield. The remaining portion of the cylinder between the outer surface and inner ring is an insulator, effectively isolating the inner ring from the outer surface. The outside surface is connected to the shield 111 of a lead-in wire and to the ground of a detector 112. This arrangement causes the outside surface to act as an electromagnetic shield, preventing stray electromagnetic fields on the outside from penetrating the antenna 110. The predominating field within the antenna 110 is therefore the field produced by the bulb being tested. That field generates a voltage on the inner ring, which is connected to the center conductor of the shielded lead-in wire and back to the antenna input of the detector 112. Good bulbs will normally have either 120V present on both sides, or 0V present on both sides. Thus, a very strong signal or a very weak signal from this antenna implies a good bulb. A bad bulb will have 120V on one side and 0V on the other. The antenna will average out the two voltages, so a signal about half way between zero and full strength will indicate a bad bulb.

The antenna of FIG. 11 works well regardless of the orientation of the bulb being tested relative to the antenna performing that test. The antennas of FIGS. 12 and 13, on the other hand, use a different approach. They require that the antennas be placed near certain "test locations" on the bulb or socket. These test locations are located on directly opposite sides of the bulb or socket, physically near the AC wires within the bulb or socket that radiate the fields. The fields radiate from the interior of the bulb or socket to the outside, and are strongest and most easily detected at the test locations.

Figure 12:
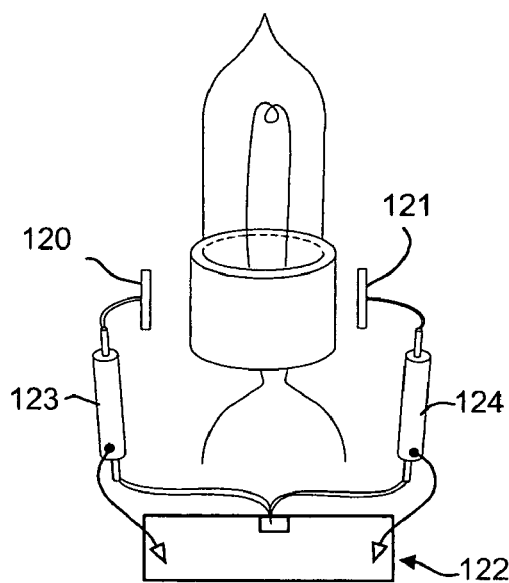

FIG. 12 illustrates dual parallel-connected antennas 120 and 121 connected in a forked configuration. The forks are spaced at a distance substantially wider then the side-to-side dimension of the bulb or socket to be sensed, so that only one antenna 120 or 121 can be placed in contact with the bulb/socket at any given time. To minimize stray pickup, each antenna 120 or 121 consists of a small plate of metal connected to a detector 122 by a shielded cable 123 or 124. The two cables are connected together at the input of the detector 122, and thus are electrically in parallel. A bad bulb or socket has a strong E field (electric field) at the test location on one side and a weak one at the test location on the other. If the fields are the same on both sides, the bulb is normally good. Thus, when one fork of the antenna touches the test location on one side of a bulb/socket, the detector will beep if an E-field of adequate strength is present. Next a fork touches the test location on other side of the bulb/socket and the test is repeated. If both touches produce beeps, or both touches produce no response, the bulb is normally good. If one side of the bulb/socket causes a beep and the other does not, the bulb is bad. Because the antennas are in parallel, the bulb's test locations may be tested from between the forks, on the outside of the forks, or using the left or right fork alone. The clearance, or lack thereof, in a Christmas tree will often determine the best method.

Figure 13:
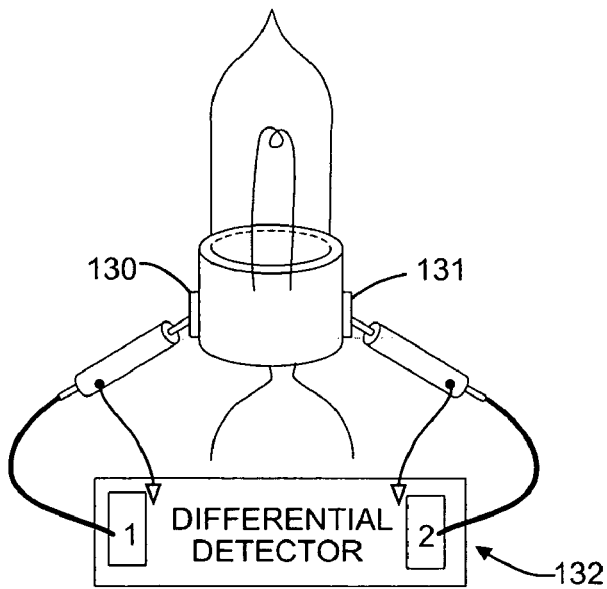

FIG. 13 illustrates an antenna designed for use with a differential detector. With differential detection the E (electric) field at the test location on one side of a bulb is electrically subtracted from that at the test location on the other side. The illustrative antenna consists of two small metal plates 130 and 131, which are placed in simultaneous contact with the opposite sides of the socket or bulb at the test locations that radiate the E field. The E field at one antenna is then subtracted from that at the other by the attached differential detector. Unlike FIG. 13, the antennas of FIGS. 10-12 are designed for use with detectors having a single antenna input. They are designed to detect lights connected to grounded, unbalanced, power sources wherein one of the power conductors is connected to ground. In cases where the AC source is grounded in a different fashion, or is not grounded at all, they do not give reliable performance. In such cases differential detection is needed. Several examples are described below.

When a bulb fails in a transformer-fed ungrounded light string, there is no electrical connection to ground, and thus the E field produced is primarily between the two output leads of the transformer secondary. What E field does exist to ground is the result of various stray capacitances, and thus is largely undefined. Detectors having a single antenna input ("single-ended detectors"), which sense relative to ground, are not suitable for this situation. The differential detector, however, only responds to the difference between the E fields at the two test locations on the opposite sides of a bulb or socket. The blown bulb exhibits a large voltage drop from terminal to terminal, and consequently a large E-field differential exists, while those that are not blown exhibit no voltage drop or E-field differential.

As a second example, consider a single blown bulb in a light string fed by a transformer with a center tap connected to ground. The grounded center tap causes the transformer's AC output to be balanced with respect to ground. Because the output is balanced, whenever the instantaneous AC output voltage at one transformer terminal is +V, the output at the other terminal will be −V. Likewise, the bad bulb will have +V on one side and −V on the other side. A detector with a single antenna input responds only to the magnitude of the antenna signal. Since the magnitudes of both +V and −V are identical, it will respond identically to both sides of the bad bulb. But as noted earlier, identical responses on both sides of a bulb normally mean that the bulb is good. A single-ended detector will therefore not work in this instance, even if it has more than one antenna connected to its single antenna input. A differential detector, however, will detect the presence of the voltage +V associated with the E field on one side of the bulb, and the presence of the second voltage −V associated with the E field on the other side. The detector internally subtracts the two, (+V)−(−V)=2V, and then generates an output proportional to the electric-field/voltage differential across the bad bulb and activates an alarm to indicate the presence of a bad bulb.

Both single-ended and differential detectors have their advantages, but when dealing with light strings fed from ungrounded or balanced AC sources, the differential detector is the better choice. The antennas 130 and 131 in FIG. 13 are not connected in parallel like those of FIG. 12. Each antenna is instead connected to its own separate input on a differential detector 132, which is designed to handle two separate antennas. Also, unlike the antennas of FIG. 12, the two antennas of FIG. 13 are simultaneously in contact with the sides of the bulb, permitting the electric fields from two separate sources to be sensed simultaneously.

Figure 14:
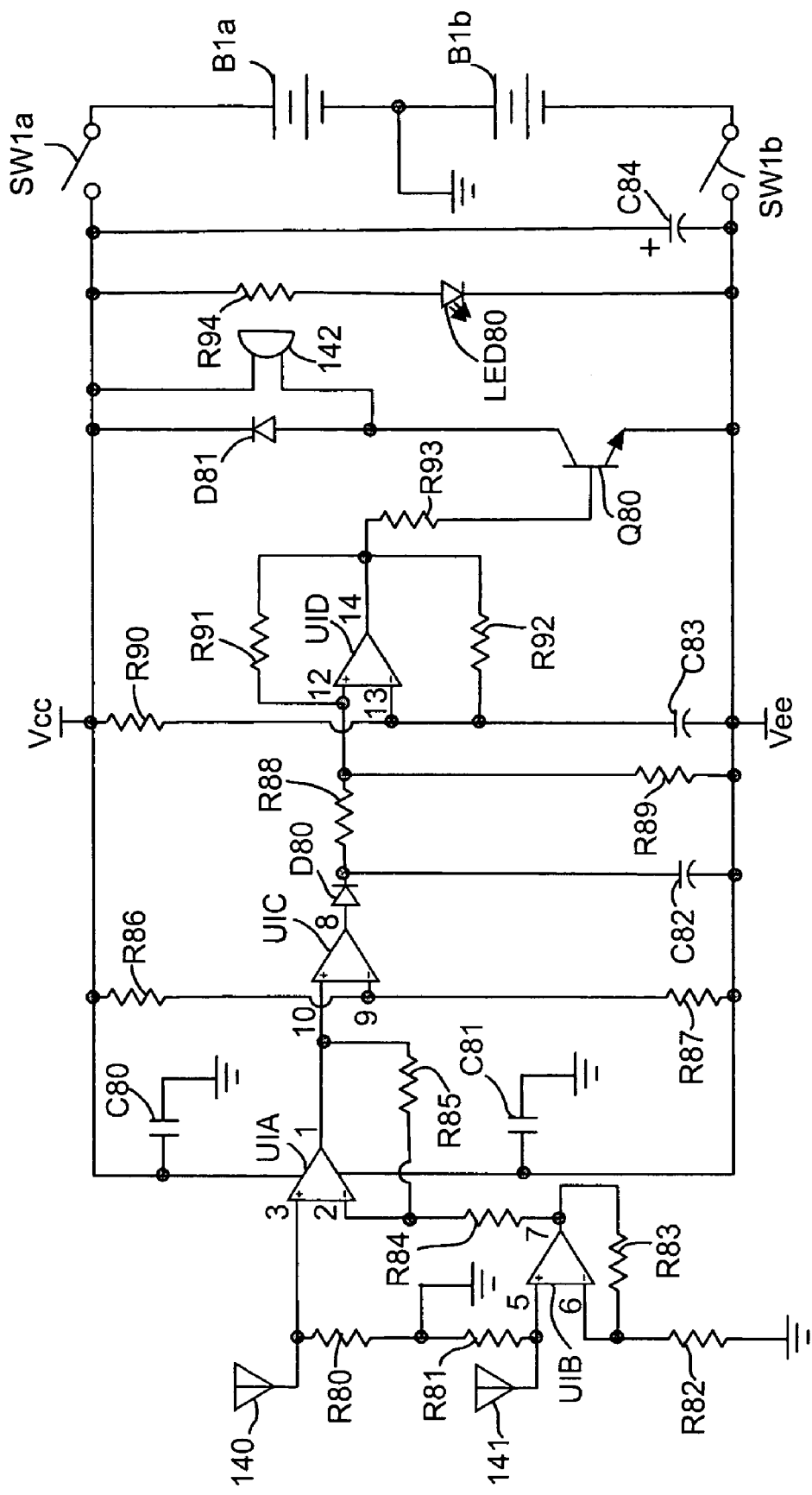
FIG. 14 is a schematic diagram of another electronic circuit for identifying, through the use of differential detection, the location of a malfunctioning bulb in a light string.

FIG. 14 shows a differential detector suitable for use with a pair of antennas 140 and 141, like the antennas 130 and 131 of FIG. 13. The output of antenna 140 is applied to pin 3 of an op amp U1A, which is configured as a high input impedance non-inverting amplifier having a gain of (R85+R84)/R84 between pins 3 and 1. The output of antenna 141 is applied to pin 5 of a similar high input impedance non-inverting op amp U1B having a gain of (R83+R82)/R82 between pins 5 and 7. The output of op amp U1B is applied through the resistor R84 to the inverting pin 2 of op amp U1A. The gain between pins 7 and 1 is (−R85/R84). The gain between pin 5 of op amp U1B and pin 1 of op amp U1A is therefore {(R83+R82)/R82}*(−R85/R84). If R85=R82 and R84=R83, the gain between pins 5 and 1 becomes {(R84+R85)/R85}*(−R85/R84)={−(R85+R84)/R84}, which is the negative of the gain between pins 3 and 1. Op amps U1A and U1B therefore comprise a differential amplifier whose output at pin 1 is Vout={(R85+R84)/R84}*(V$_1$-V$_2$), where V$_1$ and V$_2$ are the respective input voltages from antennas 140 and 141.

The op amp U1C is configured as a level detector. A fixed voltage is developed between resistors R86 and R87. When the peak voltage at pin 10 exceeds the fixed voltage at pin 9, the voltage at pin 8 goes high. This voltage is detected by a diode D80 and a corresponding DC voltage appears across a capacitor C82. That voltage switches on a multivibrator employing an op amp U1D via a voltage divider consisting of resistors R88, R89, and R91. The multivibrator then develops a square wave of about 3 KHz, which is applied to the base of a transistor Q80 via resistor R93. The collector of the transistor Q80 then drives a buzzer 142 to produce an audible tone, which occurs whenever the difference between the inputs from the antennas 140 and 141 is sufficiently large. The frequency of the multivibrator is determined by the values of resistors R88, R89 and R91 and a time constant circuit formed by a negative feedback resistor R92 and a capacitor C83. A resistor R90, connected between V$_{cc}$ and the inverting input (pin 13) of the op amp U1D, maintains a small positive bias voltage on the inverting input at all times to keep the output pin of the op amp U1D at ground when the multivibrator is off. A snubber diode D81 is connected across the buzzer 142 in order to suppress voltage transients generated by the buzzer, and an LED80 is connected between V$_{cc}$ and V$_{ee}$ in order to indicate when the battery is connected to the circuit. A current-limiting resistor R94 is connected in series with LED80.

There are two separate methods for detecting malfunctioning bulbs in series-connected light strings. If the wires in the string are easily accessed and traced, the fastest and easiest method is generally detecting the E field on the wires themselves. One scans down the wires, detecting the presence of an E field. When the scanning passes a bad bulb, the E field disappears, identifying the malfunctioning bulb. In tight places such as Christmas trees, it is more convenient to use the somewhat slower method of direct detection of blown bulbs.

Figure 15:
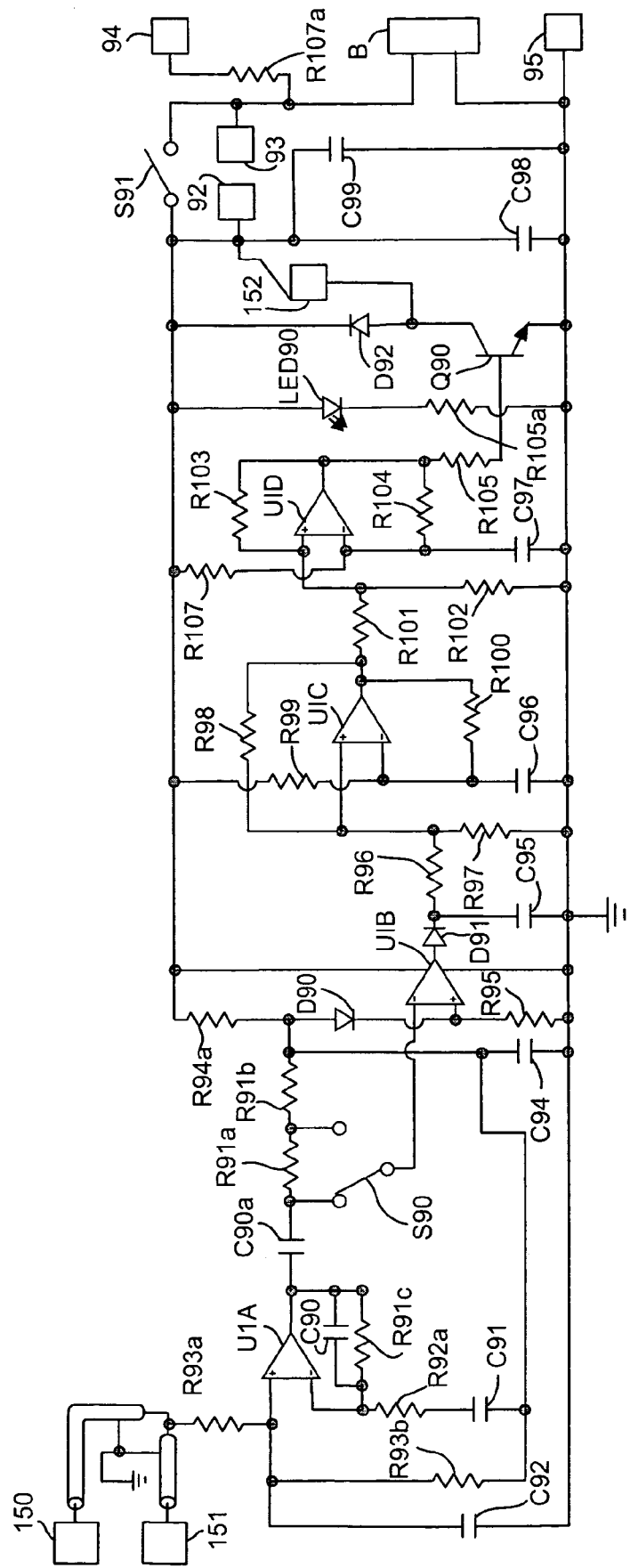
FIG. 15 is a dual-sensitivity detector capable of both bulb and wire detection.

It would be desirable for a detector to have the ability to scan in both modes. This can lead, however, to a requirement for a separate antenna for each mode and the attendant mechanical complexity. Fortunately, some antennas, such as the dual parallel-connected antennas of FIG. 12, can function well in both modes. The sensitivity requirements for optimum performance in the two modes often differ, however. FIG. 15 illustrates a modification to the front end of the circuit of FIG. 9, to allow operation as a wire detector and as a bulb/socket detector using parallel-connected antennas 150 and 151. A switch S90 selects between the full output signal available at a capacitor C90a and a reduced value signal taken from a voltage divider formed by a pair of resistors R91a and R91b. The switch selects the full signal in the WIRE mode where higher sensitivity is desired, and selects the reduced signal in TREE mode where direct bulb detection is employed. The remainder of the circuit operates in the same manner as the circuit of FIG. 9.

Either one of the two antennas 150 and 151, or both acting together, can acquire sufficient signal to operate the detector. Additionally, when the antennas are placed on opposite sides of a malfunctioning bulb and moved from side to side so as to alternately contact the test locations on each side of the bulb or socket, the buzzer 152 will change from activated to deactivated or visa versa depending upon whether or not there is AC present at that bulb terminal. This change indicates either the presence of a failed bulb whose shunt has not activated or a failure in the wiring or socket at that location.

The methods described above to detect blown bulbs are based on the assumption that the voltage on the light string is a 60 Hz (or 50 Hz) sine wave. Generally a light string is connected to an electrical outlet with one side of that outlet running back to ground, or the string is connected via a transformer to that outlet. The AC voltage powering the light string is generally not the ideal signal to use for the detection of blown bulbs, however. Even the presence and location, or the absence, of a ground can potentially confuse an E field detector.

It is possible to modify the voltage (and attendant E field) on the light string in a variety of ways, so as to make detection easier. Two such methods are:

Apply marker signals to the light string to be tested. Such signals can be picked up by the detector to aid in blown bulb detection. For example, the shape of the voltage waveform might be changed to allow alternate half cycles to be differentiated. A single-antenna detector could then be made to function somewhat like a differential detector by testing both sides of a suspect bulb with the single antenna, after which it subtracts the two readings internally.

Figure 16:
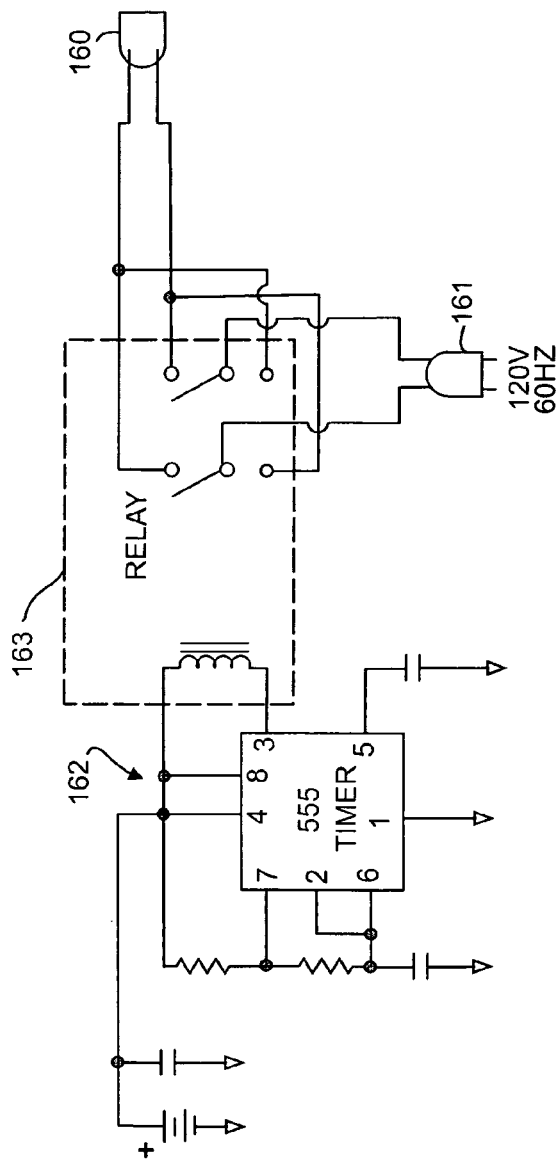
FIG. 16 is a schematic diagram of a ground switching circuit for a light string.

Modify the ground connection applied to the light string to permit direct blown bulb detection. FIG. 16 shows one such method. The light string to be tested is plugged into a socket 160 at one side of the circuit, while the other side of the circuit is connected to power line voltage with a plug 161. An astable multivibrator circuit 162 is designed to produce a square wave with a high output of about 1 second and a low output of about 0.5 second. It thus has a frequency of 1/(0.5+1) =0.67 Hz. That output switches a DPDT relay 163. The relay is supplied with line voltage from the standard wall socket plug 161 wherein one terminal connects to 120V and the other connects back to power line ground. The output of the relay is connected to a standard series-connected light string via the socket 160. Each time the relay changes state, the electrical ground is switched from one end of the light string to the opposite end. If the light string has a blown bulb, all the bulbs and wires on one side of the blown bulb will cause the detector to beep for 1 second and be off for 0.5 second. All of the bulbs and wires on the opposite side of the blown bulb will cause the detector to beep for 0.5 second and be off for 1 second. The bad bulb will either cause the detector to beep constantly, or not beep at all, depending upon detector sensitivity.

The circuit therefore makes direct bulb detection as easy as wire detection. The detector used can be simple and inexpensive. Neither dual antennas nor a differential detector would be required.

Figure 17:
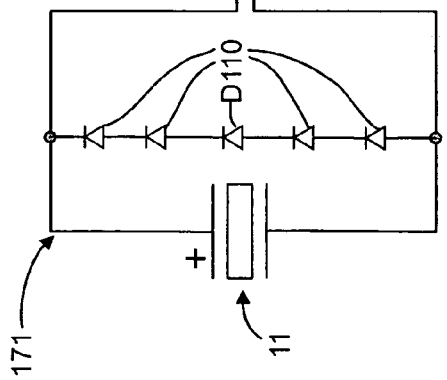
FIG. 17 is a diagrammatic illustration of an energized light string containing a failed bulb connected to a pulse generation circuit containing a piezoelectric device.

FIG. 17 is another circuit for repairing failed shunts in an otherwise operating light string. This circuit utilizes the AC line voltage in conjunction with a piezoelectric pulse to repair the defective shunts. Shown is a light string 170 with one or more defective bulbs. Connected to the string is a repair device 171 including a piezoelectric pulse generator 11 and one or more diodes D110. The repair device 171 plugs into a bulb socket 172 while the light string 170 is still plugged into an AC socket by an AC plug 173. By pulling the trigger (not shown) of the repair device 171, the piezoelectric pulse first breaks down the non-conductive material in the failed bulb. This is immediately followed by the automatic application of the half-wave-rectified AC line voltage from the AC plug 173. This energy causes the shunt to weld and thereby allow current to flow to the remaining lamps in the string. The functional lights in the light string will be illuminated at a reduced brightness with the failed bulb not illuminated. This embodiment is very useful in fixing bulb strings that have multiple functions, i.e., the lights can blink, all be on at once, etc., because it allows the functions to run during the repair.

The circuit shown in FIG. 17 is used to repair a light string while the string is connected to the standard AC power source that supplies power to the light string during normal operation. When the piezoelectric device 11 is activated, small portions of its pulse pass through the diodes D110 and develop a DC voltage across them. This DC voltage then reverse biases the diodes, effectively turning them off, so that the rest of the pulse can pass without loss to the attached light string. Thus, most of the energy contained in each pulse is conducted into the light string to at least start the oxide breakdown required to cause the shunt across a failed bulb to conduct. That conduction process then allows alternate half cycles of the AC current that normally powers the light string to pass through the diodes. This AC current is much larger than the initial piezoelectric current and is capable of permanently welding the shunt. In summary, the piezoelectric device initiates breakdown of the oxide on the shunt due to its high voltage. This initial breakdown permits the heavier 60 Hz current to flow through the shunt, and this heavier current provides enough heating to permanently weld the shunt, allowing the other bulbs in the string to glow again. It has been found that this circuit significantly increases the percentage of shunts repaired by the first pulse from the high-voltage pulse generator.

A prime consideration in the design of a detector antenna has to do with the drop off in signal that occurs as that antenna is pulled away from an electric-field source. When using direct bulb detection it is desirable to have a strong signal on the antenna only when it is within about a tenth of an inch from the bulb it is sensing. At larger distances from the bulb we want the signal to be negligible, to prevent false responses from stray fields. In the case of wire detection, however, we want the signal to drop off more slowly as the distance between the wire and antenna is increased. A useful property of the E-field, herein called the E-field gradient, can allow us to control the rate of change in antenna signal strength as an antenna's distance from an E-field source is varied.

A great deal of antenna theory has concerned itself with the use of resonant antennas used for reception, and located at a great distance from a transmitter. It is well known that the size and shape of such antennas can be tailored to control their signal gain and pick up pattern. Unfortunately, the wavelength of a 60 Hz signal is 3100 miles. A resonant antenna would be huge. There is, however a property of the E field available that can be used to advantage, the E-field gradient. The E-field detectors described above all operate relatively close to the E-field sources they sense. Within this range, the strength of the attendant E-field drops off very rapidly with distance from its source. An idealized point source E field would drop off according to the following formula. $E=K/r$, where E is the electric-field intensity, K is a constant, and r is the distance in inches from the source. Taking differentials of both sides we get $dE=-(K/r^2)*dr$. As the formula shows, the change in the strength of the E field (dE) for a fixed change in distance (dr) is always larger, the closer the antenna is to the radiating source. If the distance r=2 inches, and the antenna is moved dr=0.25 inch, then the change in E field is $\Delta E \approx dE=-(K/2^2)*(0.25)=-0.0625K$. If the distance r were smaller, i.e., r=1 inch, then $\Delta E \approx dE=-(K/1^2)*(0.25)=-0.25K$. Thus, the closer the antenna is to the radiating source, the greater will be the change in signal strength for any given movement of that antenna toward or away from the source.

Figure 18:
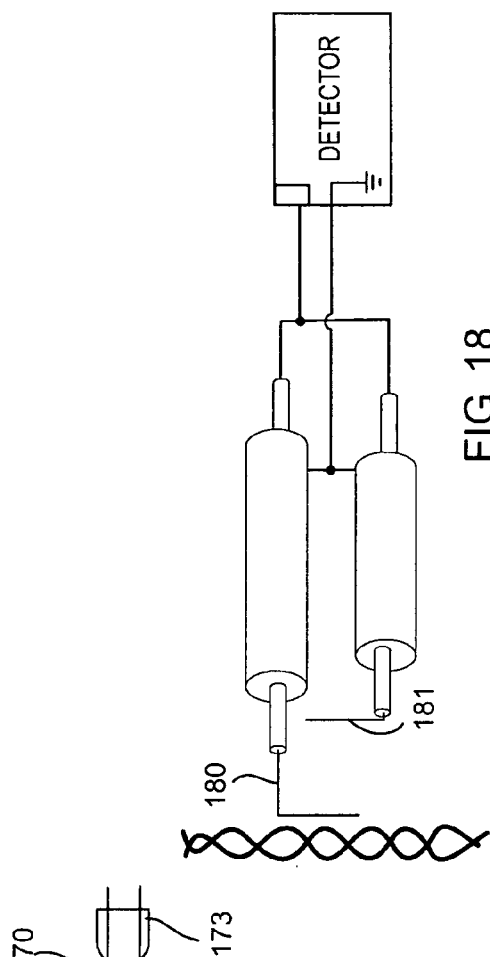
FIG. 18 is a diagrammatic illustration of a dual-antenna arrangement capable of using the electric-field gradient to enhance the detection of a failed light bulb in a light string.

Consider the antennas of FIG. 18. Two wire antennas have been connected in parallel to sense the E field around the wires of a light string. Antenna 180 is closest to the wires of the light string, and produces a large signal change for a small movement toward or away from the wires. Antenna 181 is farther away. It produces far less signal change for the same small movement. The two outputs are combined and fed to the detector's antenna input. The combined output will be less sensitive to change with distance than antenna 180 alone and more sensitive than antenna 181 alone. Thus the combined output of the two antennas now acts like a different antenna altogether. By changing the relative amount of signal pick up by the nearer antenna versus that of the farther antenna, a whole range of operating characteristics may be obtained. The use of antennas like those in FIG. 18 make wire detection much easier. They can be made more immune to the effects of the twists in the wires of the light string, and the distortion to the E field produced by the bulbs and sockets, than a simple antenna consisting of a single wire. They are also more immune to changes in sensitivity caused by the mounting location of the light string, i.e., whether the string is strung in air or laid against a surface.

The antennas of FIG. 18 are an example of the concept described below.

Choose an antenna (or antennas) with such a shape that some parts of the antenna lie closer to the object radiating the E field and other portions lie farther away.

Based on the relative distance from the radiating source to each part of the antenna, choose the dimensions of that portion of the antenna to maximize or minimize pick up, as desired.

Feed the output(s) into an E-field detector.

The antennas can consist of multiple wire antennas, such as FIG. 18. A single wire antenna can be used where the geometry of the wire is tailored for a particular response, as the example below will demonstrate. The antenna can likewise consist of one or more solid pieces of metal with shapes chosen to implement the desired pick-up behavior. Even the presence or absence of a ground on a shielded wire qualifies. In FIG. 10, for example, the rear portion of the antenna is shielded with that shield connected to the detector's ground input. Only the front portion of the antenna responds to the E field. Now if the shield connection to ground is removed and the shield is instead connected to the antenna input of the detector along with the center conductor, the result is a two-antenna system. The front portion of the antenna behaves as always, but the rear shield now acts a second antenna with a larger diameter conductor. The outputs of the shield antenna and center-conductor antenna are then combined to produce the overall response.

Antennas incorporated into current commercial detectors normally consist of a single piece of wire. In fact, a properly designed antenna is dependent on a number of factors, including the type of detection employed, the type of detector circuit that an antenna is connected to, as well as the characteristics of the E field in which it functions.

The invention claimed is:

1. A tool for locating a malfunctioning bulb in a decorative light string comprising
   a single antenna that produces a single output signal corresponding to the strength of the electric field produced by a portion of said light string near the antenna,
   a single amplifier having a single input coupled to said antenna to receive said antenna output signal and produce a single amplified output signal representing the strength of said electric field, said amplifier including a single negative feedback circuit,
   an alarm device for indicating to the user of the tool when said amplifier output signal is above or below a predetermined threshold representing a known operational condition of the light string, and
   a detector receiving said amplifier output signal and activating said alarm device when said amplifier output signal is above or below said predetermined threshold.

2. The tool of claim 1 wherein said amplifier is a single op amp having a single non-inverting input receiving a first voltage, representing said antenna output signal and a single inverting input receiving a second voltage, representing said negative feedback signal.

3. The tool of claim 2 which includes an input impedance coupled between said non-inverting input and ground, said feedback circuit includes a first impedance coupled between the output of said amplifier and said inverting input and a second impedance coupled between said inverting input and ground, and the voltage gain of said amplifier is dependent on the values of said impedances.

4. The tool of claim 1 which includes at least one lowpass filter and at least one highpass filter, or at least one bandpass filter, capable of removing unwanted high-frequency and unwanted low-frequency components from said amplifier input and output signals.

5. The tool of claim 1 wherein the open-loop voltage gain of said amplifier is at least 10 times as large as the operating closed-loop voltage gain.

6. The tool of claim 1 wherein said amplifier comprises a plurality of amplifiers connected in tandem.

7. The tool of claim 1 wherein said amplifier has a substantially linear relationship between its input and output voltages over the operating ranges of temperature and power supply voltage.

8. The tool of claim 1 wherein said negative feedback improves the stability of said amplifier with changes in temperature, supply voltage, and component substitution.

9. The tool of claim 1 which includes a device having a non-linear volt-ampere characteristic used to stabilize said predetermined threshold against changes in battery or power-supply voltage.

10. The tool of claim 9 wherein said stabilizing device includes at least one diode or transistor, or an integrated circuit containing at least one diode or transistor.

11. The tool of claim 1 wherein the shape and/or size of said antenna is determined, at least in part, by the rate at which said electric field drops off with increasing distance from said light string.

12. The tool of claim 1 wherein said single amplifier has a single input and a ground, and said single antenna is selected from the group consisting of
   an antenna comprising a piece of wire, or other conductive material, which connects to the center conductor at one end of a shielded wire, the other end of said shielded wire having its center conductor coupled to the input of said amplifier, and its shield coupled to the ground of said amplifier,
   an annular antenna having electrically conductive inner and outer surfaces electrically isolated from each other with the inner surface coupled to the input of said amplifier via the center conductor of a shielded wire and the outer surface coupled to the ground of said amplifier via the shield of said wire, and
   a dual antenna configured in a forked arrangement with each antenna being coupled to the input of said amplifier via the center conductor of a shielded wire, the center conductors being connected in parallel at the input of said amplifier, and the shields being connected in parallel at the ground of said amplifier.

13. A method of locating a malfunctioning bulb in a decorative light string comprising
   passing a single antenna along the light string to produce a single output signal corresponding to the strength of the electric field produced by the portion of said light string near the antenna,
   passing said output signal through a single amplifier having a single input coupled to said antenna to produce a single amplified output signal representing the strength of said electric field, said amplifier including a single negative feedback circuit, and
   indicating to the user of the tool when said amplifier output signal is above or below a predetermined threshold representing a known operational condition of the light string.

* * * * *